United States Patent
Hollabaugh

(10) Patent No.: US 11,561,601 B2
(45) Date of Patent: Jan. 24, 2023

(54) METHOD FOR PERFORMING SYSTEM AND POWER MANAGEMENT OVER A SERIAL DATA COMMUNICATION INTERFACE

(71) Applicant: Apple Inc., Cupertino, CA (US)

(72) Inventor: James M. Hollabaugh, San Jose, CA (US)

(73) Assignee: Apple Inc., Cupertino, CA (US)

( * ) Notice: Subject to any disclaimer, the term of this patent is extended or adjusted under 35 U.S.C. 154(b) by 79 days.

(21) Appl. No.: 16/894,615

(22) Filed: Jun. 5, 2020

(65) Prior Publication Data

US 2021/0382540 A1    Dec. 9, 2021

(51) Int. Cl.
| | | |
|---|---|---|
| G06F 1/3234 | (2019.01) | |
| G06F 13/42 | (2006.01) | |
| H03M 9/00 | (2006.01) | |

(52) U.S. Cl.
CPC ........ G06F 1/3253 (2013.01); G06F 13/4204 (2013.01); G06F 13/4282 (2013.01); G06F 2213/0042 (2013.01); H03M 9/00 (2013.01)

(58) Field of Classification Search
CPC .... H03M 9/00; G06F 1/3253; G06F 13/4204; G06F 13/4282; G06F 2213/0042; G06F 13/4072; G06F 13/4295; H04L 25/4906
USPC ............ 375/1.012; 710/52; 713/503
See application file for complete search history.

(56) References Cited

U.S. PATENT DOCUMENTS

| | | | | |
|---|---|---|---|---|
| 5,555,552 A | * | 9/1996 | Kawaguchi ............ | H04M 1/24 455/226.1 |
| 5,802,358 A | * | 9/1998 | Konomi ................ | H04J 3/062 713/503 |
| 5,974,369 A | * | 10/1999 | Radtke ................ | G01D 4/004 702/199 |
| 6,064,697 A | * | 5/2000 | Yoshikawa ........... | H03M 5/145 375/242 |
| 7,127,631 B2 | | 10/2006 | D'Angelo et al. | |
| 7,176,742 B2 | | 2/2007 | Aksin et al. | |
| 10,630,314 B1 | * | 4/2020 | Kulkarni ............. | G06F 13/4295 |
| 2005/0077976 A1 | | 4/2005 | Cohen et al. | |

(Continued)

OTHER PUBLICATIONS

International Search Report and Written Opinion in International Application No. PCT/US2021/034253, dated Sep. 13, 2021, 11 pages.

*Primary Examiner* — Faisal M Zaman
(74) *Attorney, Agent, or Firm* — Kowert Hood Munyon Rankin and Goetzel PC; Rory D. Rankin

(57) ABSTRACT

A system and method for efficiently transferring data between devices. In various embodiments, a host computing device receives parallel data, encodes the parallel data as a count of pulses as serial data, and conveys the serial data to a peripheral device. The peripheral device decodes the received serial data to determine the parallel data, which is sent to processing logic. The devices send the encoded pluses on a bidirectional line, so the pulses are capable of being sent in both directions. The devices send the encoded pulses on the bidirectional line using a non-zero base voltage level. The devices are capable of using a voltage headroom when conveying encoded pulses between one another. Therefore, a full voltage swing between a ground reference voltage level and a power supply voltage level is not used when conveying the encoded pulses, which reduces power consumption.

20 Claims, 15 Drawing Sheets

Symbol Generation Table 150

| | | Current Pin State | | | |
|---|---|---|---|---|---|
| | b0 | 0 | 0 | 1 | 1 |
| b0 b1 | b1 | 0 | 1 | 0 | 1 |
| Prev Pin State | 0 0 | A | B | C | D |
| | 0 1 | C | A | D | B |
| | 1 0 | B | D | A | C |
| | 1 1 | D | C | B | A |

| Symbol | Pulses Generated |
|---|---|
| A | 0 |
| B | 1 |
| C | 2 |
| D | 3 |

Symbol Mappings 160

(56) References Cited

U.S. PATENT DOCUMENTS

| | | | |
|---|---|---|---|
| 2006/0209784 A1* | 9/2006 | Cheng Gang | H03M 9/00 370/350 |
| 2007/0073943 A1* | 3/2007 | Saeki | G06F 13/4018 710/71 |
| 2008/0180288 A1* | 7/2008 | Lee | H03M 9/00 341/100 |
| 2009/0041098 A1* | 2/2009 | Mizukawa | H04L 25/4906 375/214 |
| 2010/0040191 A1* | 2/2010 | Ubarretxena Belandia | G01K 7/32 377/25 |
| 2014/0211894 A1* | 7/2014 | Yang | H04L 25/4902 375/354 |
| 2015/0295562 A1* | 10/2015 | Agarwal | G01N 33/0047 73/23.3 |
| 2017/0246455 A1 | 8/2017 | Athos et al. | |
| 2017/0344341 A1 | 11/2017 | Marr, Jr. et al. | |
| 2019/0296723 A1* | 9/2019 | Tang | G06F 1/10 |
| 2021/0382540 A1* | 12/2021 | Hollabaugh | H04L 25/4906 |

\* cited by examiner

*Symbol Generation Table 150*

| Prev Pin State | | Current Pin State | | | |
|---|---|---|---|---|---|
| | b0 | 0 | 0 | 1 | 1 |
| b0 | b1 | 0 | 1 | 0 | 1 |
| 0 | 0 | A | B | C | D |
| 0 | 1 | C | A | D | B |
| 1 | 0 | B | D | A | C |
| 1 | 1 | D | C | B | A |

| Symbol | Pulses Generated |
|---|---|
| A | 0 |
| B | 1 |
| C | 2 |
| D | 3 |

Symbol Mappings 160

*FIG. 2*

METHOD FOR PERFORMING SYSTEM AND POWER MANAGEMENT OVER A SERIAL DATA COMMUNICATION INTERFACE

BACKGROUND

Technical Field

Embodiments described herein relate to the field of computing systems and, more particularly, to efficiently transferring data between devices.

Description of the Related Art

Users connect a variety of peripheral devices to host computing devices for business and entertainment purposes. Examples of such peripheral devices include portable data storage devices, multimedia devices, printers, scanners, cameras, and so forth. Some examples of host devices include a desktop computer, a laptop or tablet computer, a smartphone, and a multimedia system in a vehicle. In many applications, the interface already supports connection and later reconnection of the peripheral devices. In many designs, the interface uses a bidirectional signal bus for data transfer between the host computing device and the peripheral device.

Generally speaking, communication protocols determine the format of control signals, the voltage levels used, and the timing of signals transferred across the signal bus. Logic within an interface on each of the host computing device and the peripheral device supports a selected one of a variety of communication protocols. While transferring data across the signal bus, the peripheral device consumes power. As each generation of communication protocols often supports larger bandwidths, power consumption also increases.

In view of the above, methods and mechanisms for efficiently transferring data between devices are desired.

SUMMARY

Systems and methods for efficiently transferring data between devices are contemplated. In various embodiments, a transmitter and a receiver have one or more data lines between them. The transmitter receives multi-bit data which is to be conveyed to a receiver. Control logic in the transmitter encodes the received multi-bit data into a series of pulses. The encoded pulses represent the received data. The transmitter sends the encoded pulses to the receiver. In some embodiments, the transmitter sends the encoded pulses on a single data line. Therefore, the transmitter receives parallel, multi-bit data and pulse encodes the received data into serial data. In various embodiments, the receiver receives the serial, pulse encoded data, and control logic in the receiver decodes the received data. By decoding the received serial data, the control logic of the receiver recreates the parallel, multi-bit data received earlier by the transmitter. The control logic in the receiver sends the decoded multi-bit data to processing logic.

In some embodiments, a power management unit determines when the transmitter and the receiver deactivate, or otherwise, power down one or more data lines. In one embodiment, the transmitter and the receiver power down one data line of two data lines between them, which reduces power consumption. In some embodiments, the transmitter and the receiver transition between a data transmission mode and another, smaller idle mode during data transmission. Instead of transmitting data as the data is received until all of the received data is transmitted, the transmitter stores received data in one or more buffers. When the time interval for idling ends, the data is read from one of the buffers and transmitted to the receiver for another time interval. The process repeats until all of the data is transmitted.

In some embodiments, the transmitter and the receiver use a voltage headroom when conveying encoded pulses between one another. The voltage headroom provides even further power consumption reduction. In an embodiment, the idle voltage level is greater than a power supply voltage level by a voltage headroom. In one embodiment, the data transmitting voltage level is greater than the idle voltage level by the voltage headroom. Therefore, a full voltage swing between a ground reference voltage level and a power supply voltage level is not used when conveying encoded pulses. In some embodiments, the interface supports a master/slave architecture such as the Universal Serial Bus (USB) standard serial bus protocol for connecting devices. In other embodiments, another communication protocol is used.

These and other embodiments will be further appreciated upon reference to the following description and drawings.

BRIEF DESCRIPTION OF THE DRAWINGS

The above and further advantages of the methods and mechanisms may be better understood by referring to the following description in conjunction with the accompanying drawings, in which:

FIG. 2 is a block diagram of one embodiment of a symbol generation table.

Figure 1:
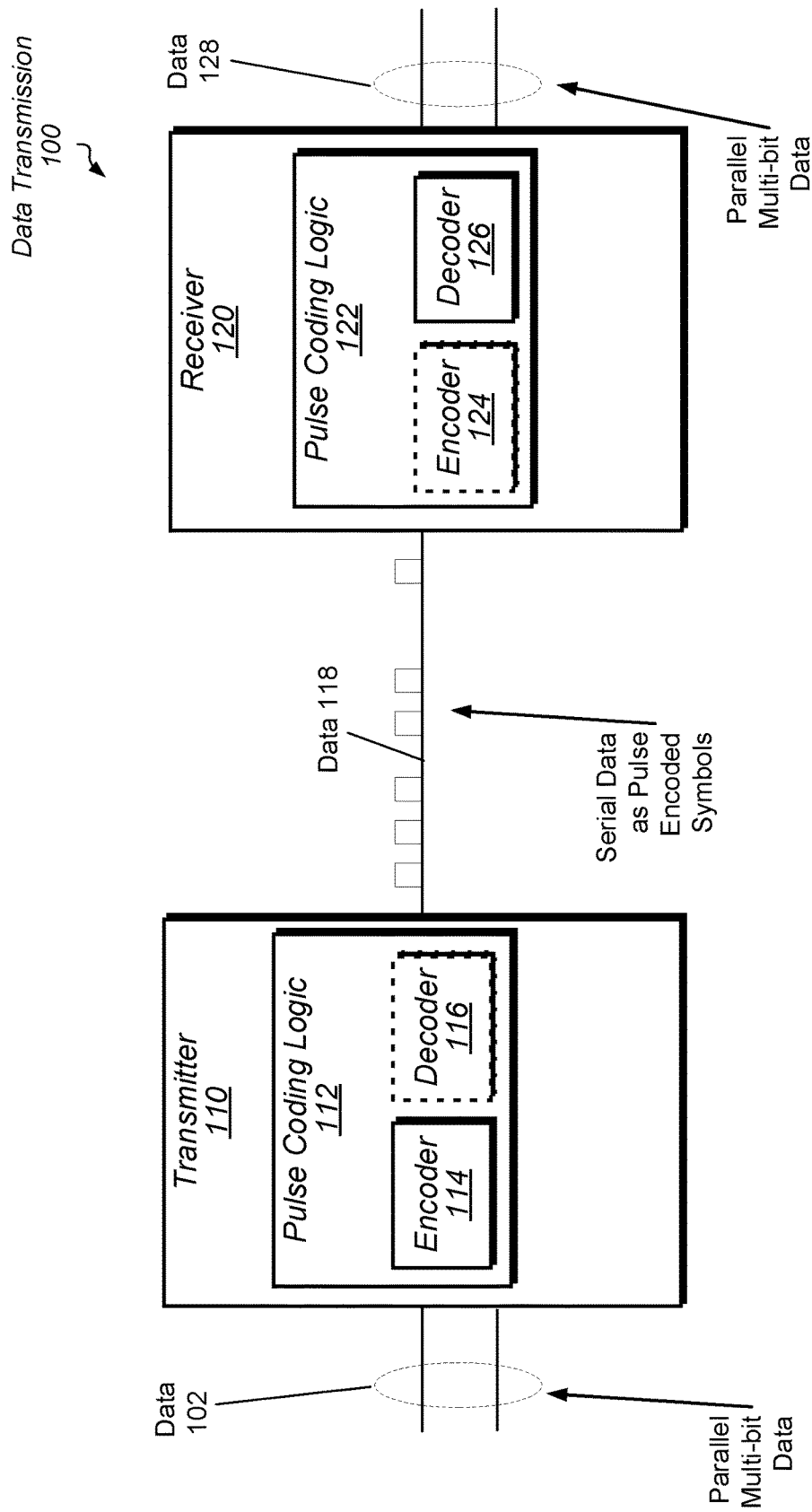
FIG. 1 is a block diagram of one embodiment of data transmission.

While the embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) for that unit/circuit/component.

DETAILED DESCRIPTION OF EMBODIMENTS

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

Referring to FIG. 1, a generalized block diagram of one embodiment of data transmission 100 is shown. In various embodiments, a transmitter 110 receives parallel multi-bit data 102, and conveys serial data 118 as encoded pulses to a receiver 120. The encoded pulses of the serial data 118 represents the parallel multibit data 102 received on multiple pins of the transmitter 110. In some embodiments, the receiver 120 generates parallel multibit data 128 from the received serial data 118, and conveys the data 128 to external processing logic (not shown). In an embodiment, each of the transmitter 110 and the receiver 120 includes pulse coding logic 112 and 122, respectively. Each of the pulse coding logic 112 and 122 is implemented by hardware, such as circuitry, or by software, such as firmware, or a combination of hardware and software.

The pulse coding logic 112 includes an encoder 114 for generating the serial data 118 as encoded pulses from the received parallel data 102. In an embodiment, the encoded pulses in the serial data 118 includes symbols where each symbol represents a portion of the parallel multibit data 102. Each symbol uses a particular number of pulses to represent parallel data. In one embodiment, a symbol with three pulses indicates a particular 2-bit state while another symbol with two pulses indicates a different 2-bit state, and so on. Other numbers of pulses and parallel bits are possible and contemplated in other embodiments. In some embodiments, the transmitter 110 sends the symbols as data 118 on a single data line to the receiver 120.

In various embodiments, the decoder 126 of the pulse coding logic 122 receives the symbols of the serial data 118, and converts each symbol to a portion of the parallel multibit data 128. By decoding the received symbols of the serial data 118, the decoder 126 recreates the parallel multi-bit 102 as the parallel multibit data 128. In one embodiment, the decoder 126 distinguishes the symbols from one another, counts a number of pulses in a particular symbol, and maps the number of pulses to a particular number of parallel bits. In an embodiment, the decoder 126 counts one pulse in a particular symbol and maps the count of one pulse to a particular 2-bit state. The data transfer between the transmitter 110 and the receiver 120 uses the symbols for representing parallel data where there is not a one-to-one relation between a pulse and a bit of data. Rather, a varying number of pulses are used to represent a same number of parallel bits. In one embodiment, parallel 2 bits are capable of representing 4 states. Rather than send 4 serial bits, the transmitter 110 sends a number of pulses in a range of 0 to 3 pulses to represent one of the 4 states for the 2 parallel bits. In other embodiments, other numbers of parallel bits and pulses used to represent the parallel bits are used.

In some embodiments, one or more data lines between the transmitter 110 and the receiver 120 is a bidirectional data line. To support the bidirectional transfer of data, the pulse coding logic 112 uses the decoder 116, which has the equivalent functionality of the decoder 126. Similarly, the pulse coding logic 122 uses the encoder 124, which has the equivalent functionality of the encoder 114. In some embodiments, the transmitter 110 and the receiver 120 support a master/slave architecture such as the Universal Serial Bus (USB) standard serial bus protocol for connecting devices. In other embodiments, another communication protocol is used.

Although pulses using voltage levels are described above for indicating the mapping between the previous pin state and the current pin state of data being transmitted, in other embodiments, the logic of the I/O interfaces use other events. For example, instead of using pulses of voltage levels, in other embodiments, the logic uses one of a fixed frequency voltage carrier signal on a physical wire for indicating on/off switching and amplitude shift keying, magnetic or inductive coupling, electrostatic or capacitive coupling, optical coupling and a wireless ratio interface capable of transmitting events.

Turning now to FIG. 2, a generalized block diagram of one embodiment of a symbol generation table 150 (or table 150) is shown. In the illustrated embodiment, the symbol generation table 150 maps a 2-bit previous pin state to a 2-bit current pin state. In various embodiments, the table 150 performs the mapping based on a number of pulses received on a single data signal line during a time interval. However, in other embodiments, another number of parallel bits is used for the pin states. Although a particular mapping is shown in the table 150, in other embodiments, another mapping is possible and contemplated.

The transmitter and the receiver use the table 150 and the symbol mappings 160 to support the transfer of parallel multibit data as serial data on a single data line. In various embodiments, each of the transmitter and the receiver use a copy of the table 150 and the symbol mappings 160. The transmitter determines it is time to send data based on a variety of conditions. When the transmitter has parallel multibit data to send to the receiver, the transmitter divides the parallel multibit data into contiguous portions or sections. Each section has a current pin state. In one embodiment, each section has 2 bits. In other embodiments, each section has another number of parallel multiple bits.

The transmitter maintains a previous pin state, which was the current pin state during a previous data transfer. Using table 150, the control logic of the transmitter identifies a row of table 150 based on the previous pin state and identifies a column based on the current pin state. For the initial 2 bits to send, the previous pin state is a state used during an earlier data transfer or a default pin state known to each of the transmitter and the receiver. The logic uses the resulting symbol and the symbol mappings 160 to determine a number of pulses to send within a time interval, and the number of pulses represents the current pin state.

The notation "2'b" denotes a 2-bit binary value, and as shown, when the previous pin state is 2'b01 and the current pin state to send is 2'b10, the control logic of the transmitter selects the second row from the top of table 150 based on the previous pin state. The control logic selects the third column from the left of table 150 based on the current pin state, and identifies the symbol "D." The control logic uses the symbol mappings 160 to determine the symbol "D" represents a count of 3 pulses to send on a serial data line to a receiver. In some embodiments, the transmitter sends the 3 pulses within a time interval to indicate the symbol "D."

In an embodiment, when the transmitter sends no pulses during the time interval, the current pin state equals the previous pin state. This mapping is indicated by the top row of the symbol mappings 160, and the symbol "A" in the table 150. The symbol mappings 160 maps no pulses, or zero pulses, to the symbol "A." When the transmitter sends one pulse during a time interval, only a particular bit of the current pin state changes. In some embodiments, the particular bit is the least significant bit indicated as "b1" in the table 150. In other embodiments, the particular bit is the most significant bit indicated as "b0" in the table 150.

The control logic of the receiver counts a number of received pulses within a time interval and uses the symbol mappings 160 to determine the symbol. The control logic of the receiver selects a row of table 150 based on the previous pin state and selects a column based on the symbol read from the mappings 160. The selected column provides the current pin state. The control logic sends the current pin state to one or more of data storage and processing logic.

Figure 3:
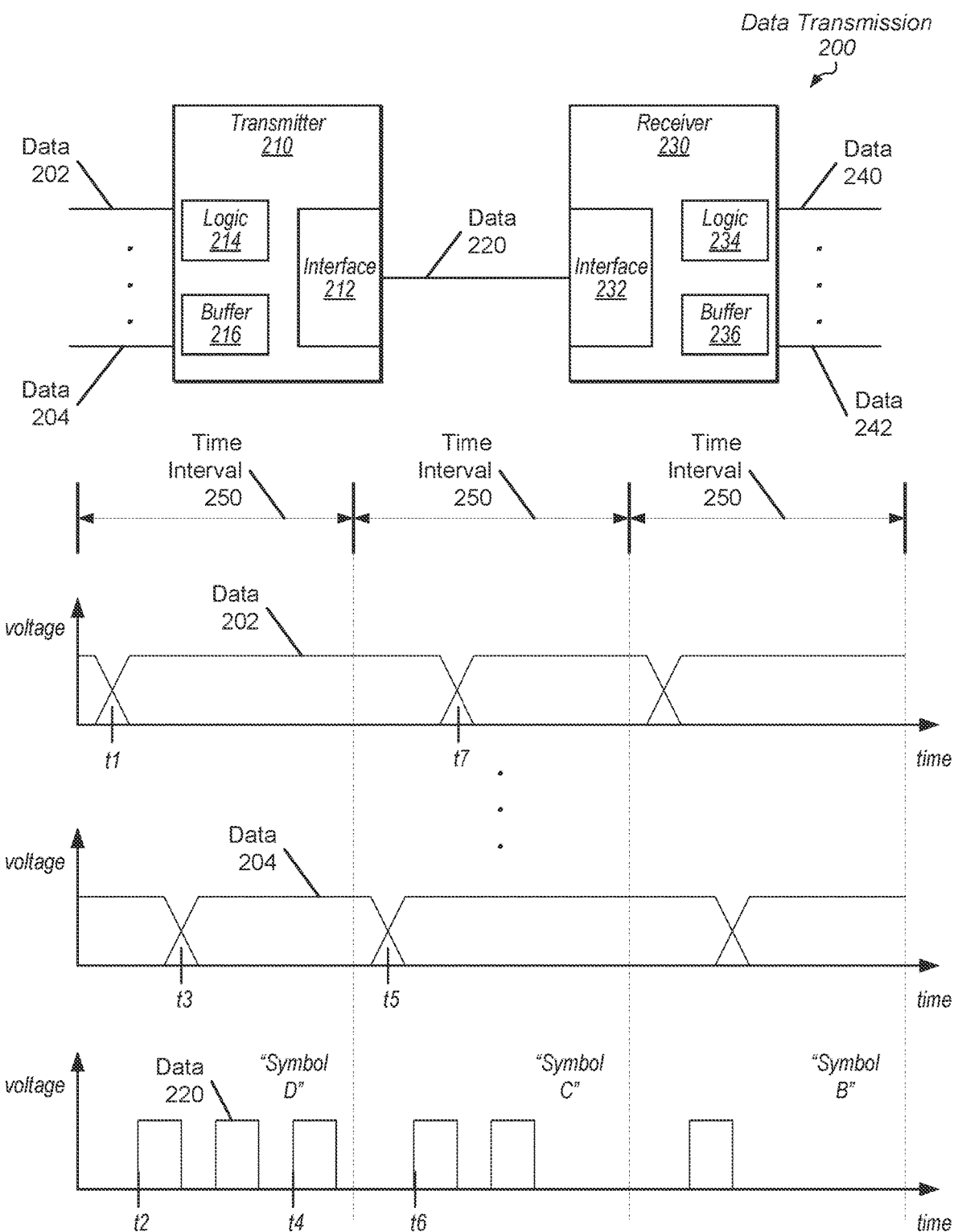
FIG. 3 is a block diagram of one embodiment of data transmission.

Referring to FIG. 3, a generalized block diagram of one embodiment of data transmission 200 is shown. In various embodiments, a transmitter 210 and a receiver 230 have one or more data lines between them. Although a communication protocol uses multiple data lines between the transmitter 210 and the receiver 230, in some embodiments, a single data line is used while one or more other data lines are deactivated, or otherwise, powered down. In one embodiment, the transmitter 210 and the receiver 230 use a single activated (powered on) data line for transferring data 220 between them. The transmitter 210 receives data 202 and data 204 from external processing logic (not shown), and sends data 220 as a representation of the received data 202 and data 204. The receiver 230 receives the data 220, and decodes, or otherwise maps, the received data 220 as the data 202 and the data 204. The receiver sends the decoded data as data 240 and data 242 to external processing logic (not shown).

The transmitter 210 includes control logic (or logic 214), a buffer 216 for storing received data 202 and 204, and interface 212 for transferring data 220 with the receiver 230. Similarly, the receiver 230 includes control logic (or logic 234), a buffer 236 for storing received data 240 and 242, and interface 232 for transferring data 220 with the transmitter 210. Each of the logic 214 and 234 is implemented by one or more of hardware, such as control circuitry, and software such as firmware and software applications. Each of the buffers 216 and 236 is implemented with flip-flops, one of a variety of types of random access memory (RAM), content addressable memory (CAM), or other. In some embodiments, the transmitter 210 and the receiver 230 use an activated bidirectional data line between them, so at times, the transmitter 210 sends data to the receiver 230, and other times, the receiver 230 sends data to the transmitter 210. When the receiver 230 sends data to the transmitter 210, in an embodiment, the receiver 230 receives data 240 and 242 on bidirectional data lines, and similarly, the transmitter sends data 202 and 204 on bidirectional data lines. In other embodiments, each of the transmitter 210 and the receiver 230 transfer data on other data lines (not shown).

The logic 214 and 234 determine an operating mode for the transmitter 210 and the receiver 230, respectively. When the logic 214 and 234 determine an operating mode is a data transmission mode, the logic 214 and 234 determine a source of data to transmit. One source for the transmitter 210 are the data 202 and 204 as they are received. Another source is the data stored in the buffer 216. The logic 214 selects between the two sources based on the operating mode such as a data transmission mode and a power efficient data transmission mode. Similarly, one source for the receiver 230 are the data 240 and 204 as they are received. Another source is the data stored in the buffer 236.

When the transmitter 210 operates in a data transmission mode, the logic 214 determines a current state of data to transmit within a time interval. One example of the time interval is time interval 250. Three voltage versus time diagrams are shown, one diagram each for the input data 202 and 204, and one diagram for the data 220 between the transmitter 210 and the receiver 230. In some embodiments, the time interval 250 is a duration of time determined to be sufficient for transferring data and having the data interpreted correctly for storage or use at the receiver 230. For example, the data to send in the time interval 250 is a subset or a portion of the total data to transmit over multiple time intervals. In one embodiment, the transmitter 210 may transfer one gigabyte (GB) of total data, but transfer 2 bits (binary digits) for each time interval 250. When each of the transmitter 210 and the receiver 230 are capable of transferring a 2-bit state between one another during a 90 nanosecond (ns) time interval, the time interval 250 is 90 ns. In such an embodiment, the logic 214 determines a current state. In one embodiment, the source of data are the received data 202 and 204 with a value of 2'b10 where "2'b" denotes a 2-bit binary value.

In addition to the current state, the logic 214 also determines a previous state. The previous state is a current state of an immediately previous time interval before the current time interval. When the current time interval is an initial time interval, the previous state is a default initial state. In one example, the default initial state is 2b'00. Other data sizes, time interval durations and initial states are possible and contemplated in other embodiments. In order to send the received data 202 and 204 on a single data line, the logic 214 uses each of the current state and the previous state to determine a number of pulses to send as data 220 to the receiver 230. In an embodiment, the logic 214 uses a state table that maps a previous state to a current state based on a number of pulses received as data 220 within the time interval 250. In various embodiments, the logic 234 of the receiver 230 uses a same state table in order to decode the received pulses. In various embodiments, each of the logic 214 and 234 also stores a copy of the previous state.

In one embodiment, each of the logic 214 and 234 stores a previous state of 2'b00, and the logic 214 determines the current state of the received data 202 and 204 is 2'b11. For example, at time t1, the data 202 transitions to a Boolean '1', or a logic high level, and at a later time t3, the data 204 transitions to a Boolean '1', which is also a logic low level. Using the previous state of 2'b00, the current state of 2'b11, and a state table such as the previous table 150 (of FIG. 2), the logic 214 determines 3 pulses should be sent as data 220 to the receiver 230 before the time interval 250 elapses. In an embodiment, each unique number of pulses corresponds to a symbol, which is used to map or decode to the 2-bit current state. In an embodiment, 3 pulses indicates Symbol D, 2 pulses indicates Symbol C, and one pulse indicates Symbol B. However, another combination of mappings and number of pulses in addition to another size of the states are used in other embodiments.

In an embodiment, the first pulse of Symbol D is generated at time t2, in response to the first data transition at time t1 of data 202. Therefore, the logic 214 does not wait for a fixed delay to determine each possible data transition of data 202 and 204 before starting to generate pulses. In one embodiment, the third pulse of Symbol D is generated at time t4, in response to the second data transition at time t3 of data 204. The amount of time for a last data transition on data 202 and 204, the pulse width and delays between pulses are varied from design to design, and each is used to determine the time interval 250. In various embodiments, the logic 234 uses the previous state of 2'b00, the received 3 pulses, and a state table, to determine the current state is 2'b11. The logic 234 either sends the current state of 2'b11 as data 242 and 144 or stores the current state in buffer 236.

In the next time interval 250, in an embodiment, each of the logic 214 and 234 stores a previous state of 2'11, and the logic 214 determines a current state of the received data 202 and 204. At time t5, the data 204 transitions, which causes the first pulse generated at time t6. The transition of data 202 at time t7 determines the symbol, such as Symbol C, to send, which also determines the final number of pulses to generate and send to the receiver 230. In a similar manner, in the third time interval 250, the logic 214 determines the current state is represented by Symbol B, or a single pulse, which is decoded or remapped by the logic 234 of the receiver 230.

Figure 4:
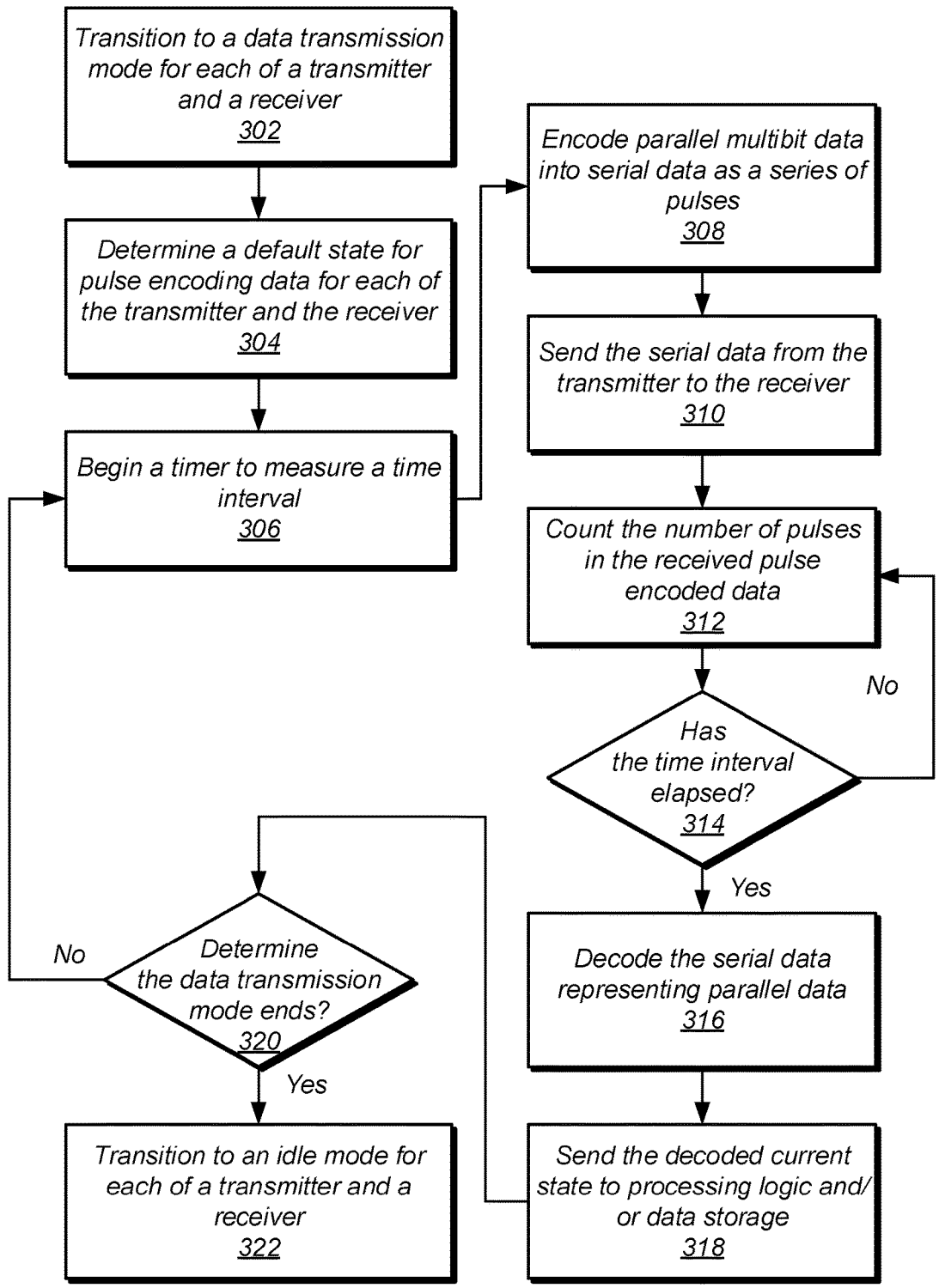
FIG. 4 is a flow diagram of one embodiment of a method for efficiently transferring data between devices.

Referring now to FIG. 4, a generalized flow diagram of one embodiment of a method 300 for efficiently transferring data between devices is shown. For purposes of discussion, the steps in this embodiment (as well as for FIGS. 5, 7 and 11-12) are shown in sequential order. However, in other embodiments some steps may occur in a different order than shown, some steps may be performed concurrently, some steps may be combined with other steps, and some steps may be absent.

Logic of I/O interfaces of a transmitter and a receiver transition the transmitter and the receiver to a data transmission mode (block 302). In various embodiments, the transmitter is one of an I/O interface of a host computing device and a peripheral device, and similarly, the receiver is the other one of the host computing device and the peripheral device. In some embodiments, the transmitter and the receiver communicate with one another using a serial data communications protocol. In various embodiments, the communications protocol determines which device is the transmitter at a particular time. The logic of the I/O interfaces determine it is time to transition from an idle mode to a data transmission mode based on one or more of determining a time interval has elapsed, determining an amount of data for transmission exceeds a threshold, and receiving a control signal indicating the transition from processing logic of one or more of the transmitter and the receiver.

The logic of the I/O interfaces determine a default state for pulse encoding data of the transmitter and the receiver (block 304). The default state is also referred to as the initial state. In the following description, the transmitter and the receiver transfer data as 2-bit states, but using a single data signal line. In other embodiments, another number of bits is used and another number of data lines. Additionally, in other embodiments, the logic and the number of data signal lines are replicated to provide a bus between the transmitter and the receiver. In various embodiments, the transmitter and the receiver store an initial state of data, which is a predetermined, default state. This initial state is used as a previous state for the first state to be transferred from the transmitter to the receiver.

After determining the initial state of the data, the transmitter logic begins a timer to measure a time interval (block 306). The amount of time for a last data transition to occur on received data, the pulse width, and the delays between pulses are varied from design to design, and each is used to determine the duration of the time interval. In an embodiment, the receiver logic does not begin a timer to measure the same time interval until a data transition is received from the transmitter. During the time interval, the transmitter encode(s) parallel multibit data into serial data as a series of pulses (block 308). In an embodiment, the transmitter determines a number (or count) of pulses based on the received current state and the stored previous state. In an embodiment, the transmitter uses a symbol generation table equivalent to the table 150 (of FIG. 2). The transmitter sends the serial data, such as the number of pulses, to the receiver (block 310).

During the measured time interval at the receiver, the receiver logic counts a number of pulses in the pulse encoded data received from the transmitter (block 312). In some embodiments, the pulses begin with a rising edge, whereas, in other embodiments, the pulses begin with a falling edge. When a rising edge is used to indicate the start of a pulse, it is noted that a last pulse may begin with a rising edge, but the falling edge may occur outside of the time interval. However, in some embodiments, the receiver logic still counts the last pulse. Similarly, when a falling edge is used to indicate the start of a pulse, when the corresponding rising edge of the last pulse occurs after the second time interval completes, the receiver logic still counts the last pulse.

If the logic of the receiver I/O interface determines that the time interval has not elapsed ("no" branch of the conditional block 314), then control flow of method 300 returns to block 312 where the logic continues counting any received pulses. If the logic of the receiver I/O interface determines that the second time interval has elapsed ("yes" branch of the conditional block 314), then the logic decodes the serial data representing parallel data (block 316). In an embodiment, the logic determines the current state of the data based on the count of pulses and the previous state. For example, the logic uses the number of pulses to map the previous state to a current state. In various embodiments, the logic determines the mapping by using a table equivalent to the table 150 (of FIG. 2).

In one embodiment, a count of no pulses indicates that the current state equals the previous state. Similarly, the logic determines a count of one pulse indicates only a particular one of the 2-bit data state changed while the logic determines a count of two pulses indicates only the other one of the 2-bit data state changed. For example, if the previous state was 2'b01 where "2'b" indicates a two bit binary value, then in an embodiment, the logic determines a count of one pulse indicates the current state is 2'b00 where only the least significant bit changed. In a similar manner, the logic determines a count of two pulses indicates the current state is 2'b11 where only the most significant bit changed. In this example, the logic determines a count of zero indicates no change, so that current state is 2'b01, and a count of three pulses indicates both bits changed, so the current state is 2'b10.

The receiver logic sends the current state to processing logic and/or data storage at the receiver (block 318). If the I/O interfaces determine that the data transmission mode has not ended ("no" branch of the conditional bock 320), then control flow of method 300 returns to block 306 where the receiver restarts the timer to measure the time interval. Otherwise, if the I/O interfaces determine that the data transmission mode has ended ("yes" branch of the conditional bock 320), then the I/O interfaces transition each of the transmitter and the receiver to another mode of operation such as an idle mode (block 322).

Figure 5:
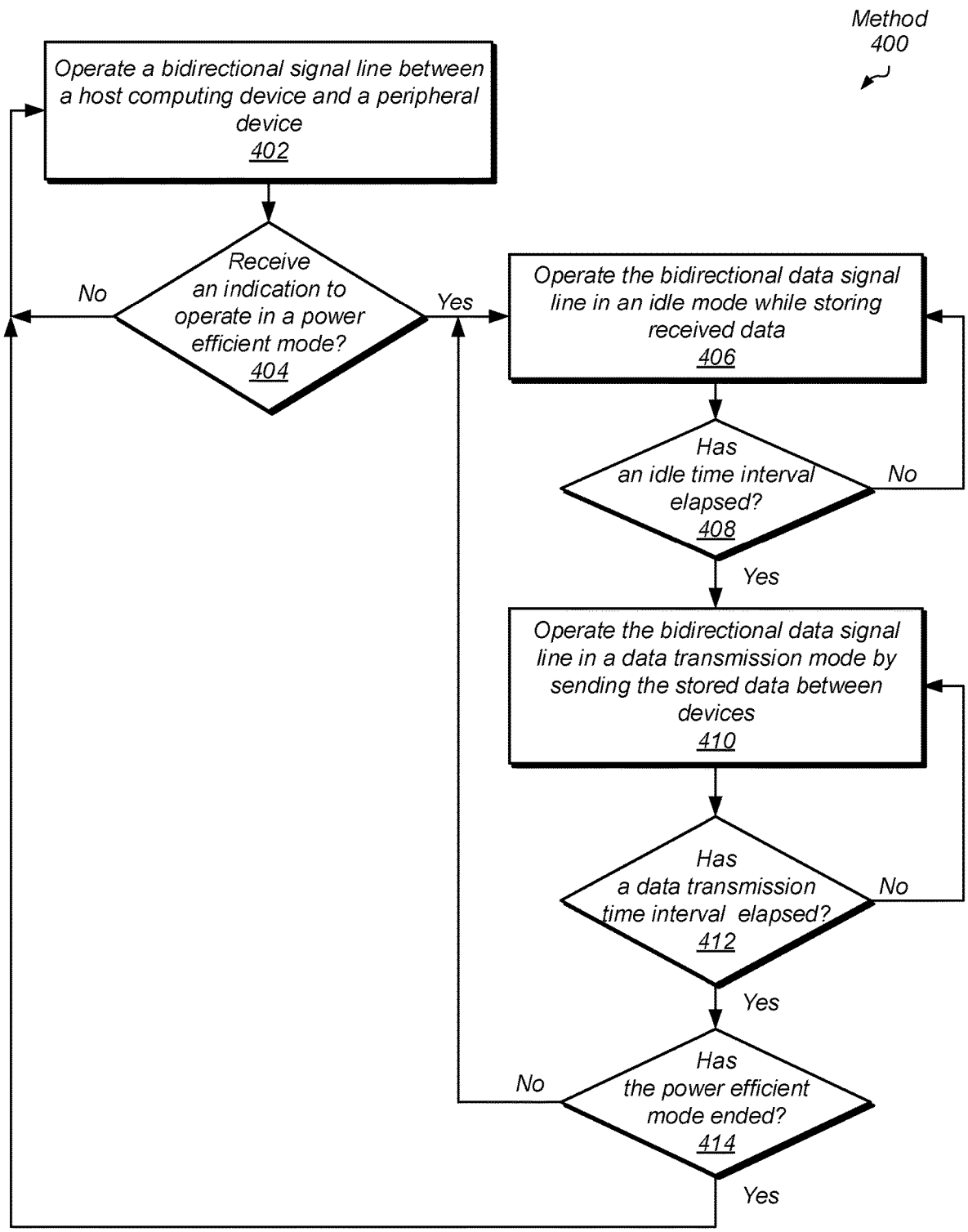
FIG. 5 is a flow diagram of one embodiment of a method for efficiently transferring data between devices.

Referring now to FIG. 5, a generalized flow diagram of one embodiment of a method 400 for efficiently transferring data between devices is shown. Logic of an interface of a device operates a bidirectional signal line between a host computing device and a peripheral device (block 402). The data transfer occurs based on a data transmission mode, an idle mode, or other. The data line is equivalent to a physical wire with contacts making a connection to other contacts or pads to create an electrical short between the host computing device and the peripheral device The interface logic is implemented in hardware, such as circuitry, in software, or a combination of hardware and software. In various embodiments, the interface logic supports a serial data communications protocol.

If the logic of one or more of the transmitter and the receiver does not receive an indication to operate in a power efficient mode ("no" branch of the conditional block 404), then control flow of method 400 returns to block 402 where the interfaces maintain a current operating mode. In some embodiments, the interfaces determine it is time to transition to the power efficient mode based on a time interval, a received indication from a power management unit, or other. If the logic of one or more of the transmitter and the receiver receives an indication to operate in a power efficient mode ("yes" branch of the conditional block 404), then the interfaces operate the bidirectional data signal line in an idle mode while storing data (block 406). Rather than sending data on the bidirectional data lines as the data is received, the interfaces store the received data in corresponding buffers while the bidirectional data line is held at a constant voltage level.

If the interfaces do not determine that it is time to end the idle mode ("no" branch of the conditional block 408), then control flow of method 400 returns to block 406 where the interfaces maintain the idle mode while storing received data. Conditions for transitioning from this idle mode to a data transmission mode include one or more of determining a time interval has elapsed, determining an amount of data stored during this idle mode exceeds a threshold, and receiving a control signal indicating a transition from processing logic of the device. If the interfaces determine that it is time to end the idle mode ("yes" branch of the conditional block 408), then the interfaces operate the bidirectional data signal line in a data transmission mode by sending the stored data between devices (block 410).

Conditions for transitioning from this data transmission mode include one or more of determining a time interval has elapsed, determining an amount of data transferred during this data transmission mode exceeds a threshold, and receiving a control signal indicating a transition from processing logic of the device. In various embodiments, the interfaces generate a series of pulses as described earlier. The receiving logic converts the pulses on the single data signal line to two or more data signals. When the communication protocol is the USB serial data communications protocol, the receiving logic converts the pulses to two data signals.

If the interfaces do not determine that it is time to end the data transmission mode ("no" branch of the conditional block 412), then control flow of method 400 returns to block 410 where the interfaces maintain the data transmission mode. If the interfaces determine that it is time to end the data transmission mode ("yes" branch of the conditional block 412), but the power efficient mode has not ended ("no" branch of the conditional block 414), then control flow of method 400 returns to block 406 where the interfaces operate the bidirectional data signal line in an idle mode while storing data. If the interfaces determine that it is time to end the data transmission mode ("yes" branch of the conditional block 412), and the power efficient mode has ended ("yes" branch of the conditional block 414), then control flow of method 400 returns to block 402 where the interfaces operate the bidirectional signal line based on a current operating mode other than the power efficient mode.

Figure 6:
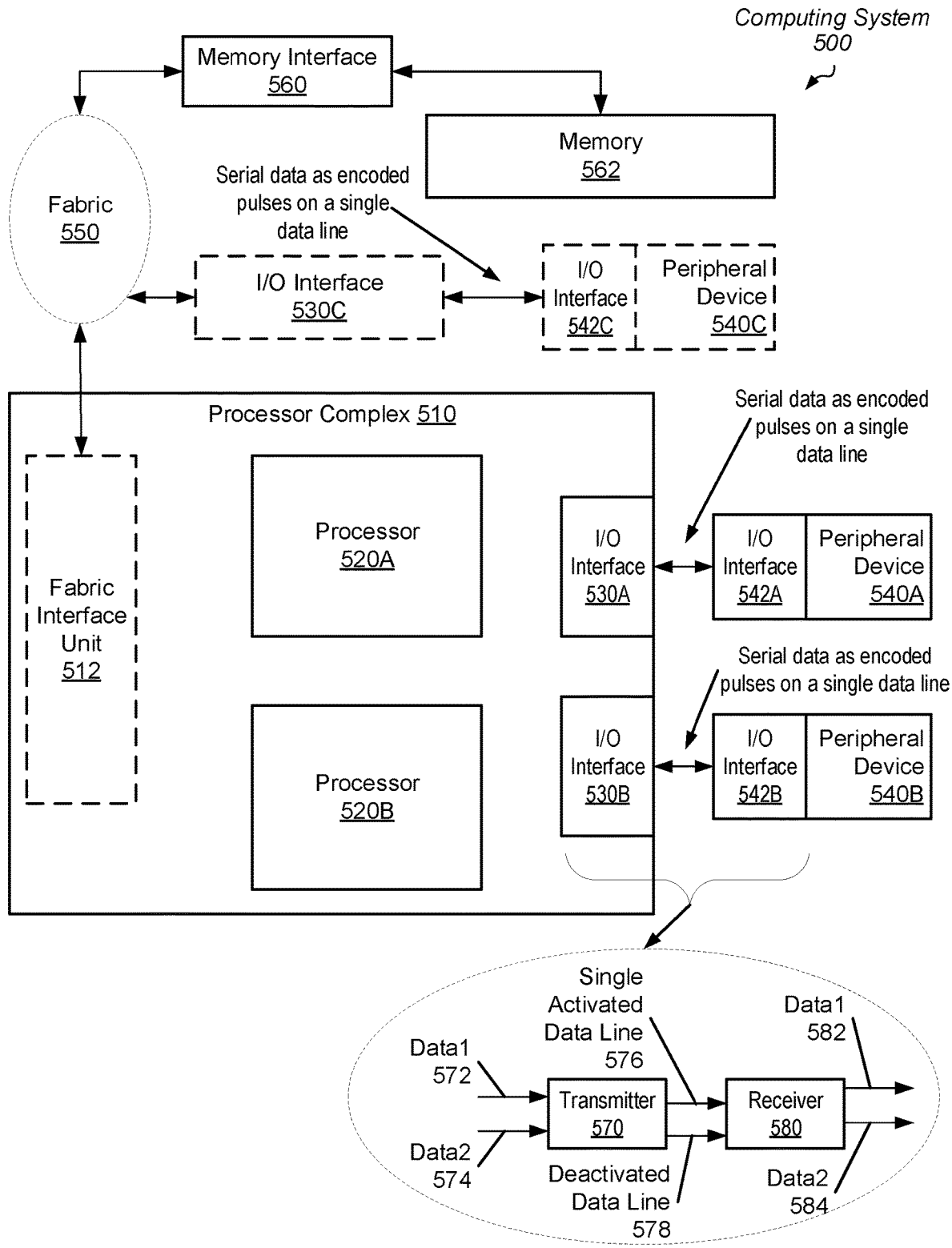
FIG. 6 is a block diagram of one embodiment of a computing system.

Referring to FIG. 6, a generalized block diagram of one embodiment of a computing system 500 is shown. In various embodiments, computing system 500 includes processor complex 510 with interfaces for connecting to peripheral devices 540A-540B and memory interface 560 for communicating with memory 562. For example, in some embodiments, the processor complex 510 includes the input/output (I/O) interfaces 530A-530B for communicating with the I/O interfaces 542A-542B of the peripheral devices 540A-540B. Clock sources, such as phase lock loops (PLLs), interrupt controllers, power managers, and so forth are not shown in FIG. 5 for ease of illustration. It is also noted that the number of components of the computing system 500 (and the number of subcomponents for those shown in FIG. 5, such as within the processor complexes 510) vary from embodiment to embodiment. For example, in some embodiments, the computing system 500 uses a communication fabric 550 (or fabric 550) for routing data between an additional input/output (I/O) interface 530C and an additional peripheral device 540C with a corresponding I/O interface 542C. In such embodiments, the processor complex 510 includes the fabric interface unit 512 for communicating with the fabric 550. In other embodiments, the computing system 500 does not include the fabric 550 and the I/O interface 530C.

In various embodiments, the computing system 500 is comprised within one of a variety of host computing devices. Examples of host computing devices are a desktop computer, a laptop or a notebook or a tablet computer, a smartphone, a multimedia system in a vehicle, and so forth. The term "processor complex" is used to denote a configuration of one or more processor cores using local storage, such as a shared cache memory subsystem, and capable of processing a workload together. As shown, processor complex 510 communicates with one or more peripheral devices such as peripheral devices 540A-540C. Examples of the peripheral devices 540A-540C are portable data storage devices, multimedia devices, printers, scanners, cameras and video cameras, keyboards, joysticks, and so forth.

For many applications, there is no need to access and install device drivers for the processor complex 510 to communicate with the peripheral devices 540A-540C. The I/O interfaces 530A-530C and 542A-542C already support connection and later reconnection of the peripheral devices 540A-540C. In various embodiments, the I/O interfaces 530A-530C and 542A-542C support a serial data communications protocol such as the Universal Serial Bus (USB) standard serial bus protocol for connecting devices with distributed real-time control and security. Although the USB protocol uses two data lines, in some embodiments, one or more of the I/O interfaces 530A-530C and 542A-542C use a single data signal line while one of the data lines is deactivated, or otherwise, powered down. As shown in one example, the I/O interfaces 530B and 542B communicate via a single data signal line 576 while the data line 578 is deactivated. In various embodiments, when an interface has parallel, multibit data to transmit on a single data line, the interface encodes the parallel data as serial data such as a series of pulses.

During a data transmission mode, whichever one of the I/O interfaces 530B and 542B is the transmitter 570 at the time sends a series of one or more pulses on the single data signal line 576 to the receiver 580. As shown, in an embodiment, the transmitter 570 receives two data signals shown as data1 572 and data2 574 on two separate data signal lines. However, the transmitter 570 sends a series of one or more pulses on the single data signal line 576 to the receiver 580. The receiver 580 detects pulses on this single data signal line 576 and converts them to two digital signals, such as data1 582 and data2 584, on two separate data lines. It is noted that although data transmission is shown from left to right in the illustrated embodiment, in other embodiments, the data transmission transfers data from right to left, since the I/O interfaces 530A-530C and 542A-542C support bidirectional data communication.

In an embodiment, the I/O interfaces 530A-530C and 542A-542C support multiple operating modes such as a data transmission mode, an idle mode and a lower power idle mode. For each of the idle mode and the lower power idle mode, the I/O interfaces 530A-530C and 542A-542C hold a constant voltage level on a corresponding single data signal line. For example, each of the transmitter 570 and the receiver 580 holds a constant voltage level on the single data line 576. The lower power idle mode uses a first voltage level less than a second voltage level of the idle mode. In one embodiment, the power supply voltage for each of the transmitter 570 and the receiver 580 is 4.0 volts, and the first voltage level is greater than or equal to 4.0 volts and less than 4.15 volts. Here, in this embodiment, a voltage headroom of 0.15 volts is used. The second voltage level is equal to the sum of the power supply voltage and the voltage headroom, or 4.15 volts. Therefore, power consumption is further reduced when the lower power idle mode is used.

The data transmission mode uses each of the second voltage level and a third voltage level greater than the second voltage level. For example, the data transmission mode uses the second voltage level of 4.15 volts and the third voltage level equal to the sum of the power supply voltage and twice the voltage headroom, or 4.30 volts. The one or more pulses sent from the transmitter 570 to the receiver 580 on the single data line 576 have voltage levels transitioning between 4.15 volts and 4.30 volts. Therefore, prior to transitioning to the data transmission mode, the interfaces 530A-530C and the peripheral devices 540A-540C first transitions from the lower power idle mode to the idle mode, and then transitions from the idle mode to the data transmission mode.

In some embodiments, the memory interface 560 uses at least one memory controller and at least one cache for the off-chip memory 562, such as synchronous DRAM (SDRAM). The memory interface 560 stores memory requests in request queues, uses any number of memory ports, and uses circuitry capable of interfacing to memory 562 using one or more of a variety of protocols used to interface with memory channels used to interface to memory devices (not shown). Memory 562 stores one or more applications, a base operating system (OS), and sometimes a virtual (guest) OS. Copies of portions of the base OS are executed by one or more of the processors 520A-520B. Memory 562 also stores source data for applications in addition to result data and intermediate data generated during the execution of applications.

In some embodiments, the processors 520A-520B use a homogeneous architecture. For example, each of the processors 520A-520B is a general-purpose processor, such as a central processing unit (CPU), which utilizes circuitry for executing instructions according to a predefined general-purpose instruction set. Any of a variety of instruction set architectures (ISAs) is selected. In some embodiments, each core within processors 520A-520B supports the out-of-order execution of one or more threads of a software process and include a multi-stage pipeline. In other embodiments, one or more of the processors 520A-520B supports in-order execution of instructions. In some embodiments, the processors 520A-520B include units for fetching instructions, decoding instructions, performing dependency checking, performing register renaming of operand identifiers and executing instructions. The processors 520A-520B may support the execution of a variety of operating systems.

In other embodiments, the processors 520A-520B use a heterogeneous architecture. In such embodiments, one or more of the processors 520A-520B is a highly parallel data architected processor, rather than a CPU. In some embodiments, these other processors of the processors 520A-520B use single instruction multiple data (SIMD) cores. Examples of SIMD cores are graphics processing units (GPUs), digital signal processing (DSP) cores, or otherwise. In various embodiments, each one of the processors 520A-520B uses one or more cores and one or more levels of a cache memory subsystem.

In various embodiments, different types of traffic flows independently through the fabric 550. The independent flow is accomplished by allowing a single physical fabric bus to include a number of overlaying virtual channels, or dedicated source and destination buffers, each carrying a different type of traffic. Each channel is independently flow controlled with no dependence between transactions in different channels. The fabric 5110 may also be packet-based, and may be hierarchical with bridges, cross bar, point-to-point, or other interconnects.

Figure 7:
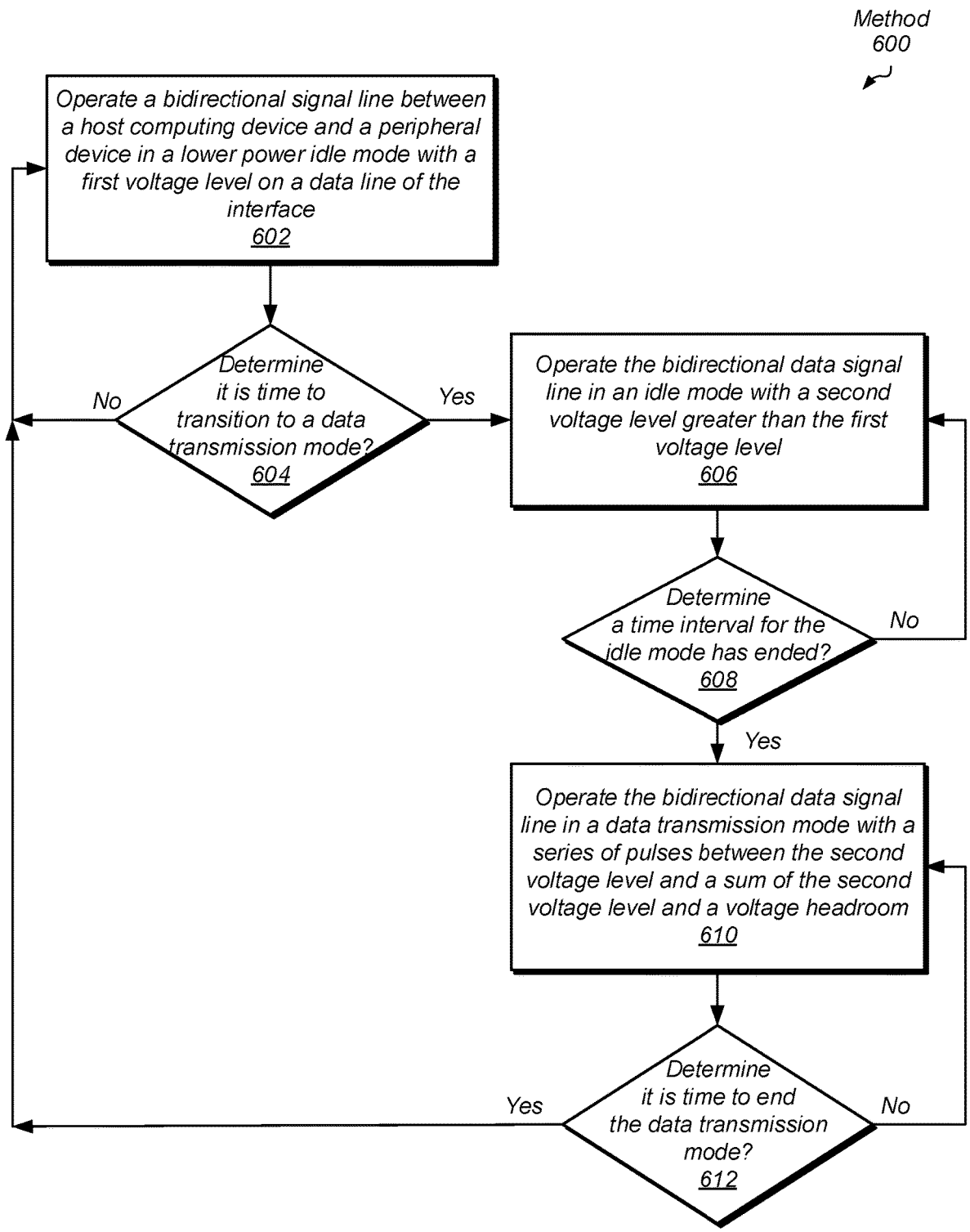
FIG. 7 is a flow diagram of one embodiment of a method for efficiently transferring data between devices.

Referring now to FIG. 7, a generalized flow diagram of one embodiment of a method 600 for efficiently transferring data between devices is shown. Logic of an interface of a device operates a bidirectional signal line between a host computing device and a peripheral device in a lower power idle mode with a first voltage level on a data line of the interface (block 602). As described earlier, the data line is equivalent to a physical wire with contacts making a connection to other contacts or pads to create an electrical short between the host computing device and the peripheral device. The interface logic is implemented in hardware, such as circuitry, in software, or a combination of hardware and software. In various embodiments, the interface logic supports a serial data communications protocol.

Although the communications protocol uses more than one data signal line, in some embodiments, the interface logic uses a single data signal line with voltage levels higher than a power supply voltage level used by interface logic of the host computing device and interface logic of the peripheral logic. In various embodiments, each of the higher voltage levels is greater than the power supply voltage level by an integer multiple of a voltage headroom. The higher voltage levels on the single data signal line create pulses that are converted to separate data signals by receiving logic. In some embodiments, the first voltage level of the lower power idle mode is equal to the power supply voltage level. In other embodiments, the first voltage level of the lower power idle mode is equal to a sum of the power supply voltage level and a voltage level less than the voltage headroom. In one example, the power supply voltage level is 4.0 volts and the voltage headroom is 0.15 volts. Therefore, in the lower power idle mode, interface logic maintains a voltage level greater than or equal to 4.0 volts and less than 4.15 volts on the single data signal line between devices.

If the interfaces do not determine that it is time to transition to a data transmission mode ("no" branch of the conditional block 604), then control flow of method 600 returns to block 602 where the interfaces maintain the lower power idle mode. In some embodiments, the interfaces determine it is time to transition to another mode based on a time interval. In other embodiments, the interfaces determine it is time to transition to another mode based on an amount of data stored for transmission exceeds a threshold. In yet other embodiments, the interfaces determine it is time to transition to another mode based on receiving a control signal indicating a transition from processing logic of the device.

If the interfaces determine that it is time to transition to a data transmission mode ("yes" branch of the conditional block 604), then the interfaces operate the bidirectional data signal line in an idle mode with a second voltage level greater than the first voltage level (block 606). As described earlier, the first voltage level of the lower power idle mode is equal to a sum of the power supply voltage level and a voltage level less than the voltage headroom. In one example, the power supply voltage level is 4.0 volts and the voltage headroom is 0.15 volts. Therefore, in the lower power idle mode, interface logic maintains a voltage level greater than or equal to 4.0 volts and less than 4.15 volts on the single data signal line between devices. In an embodiment, the second voltage level is equal to a sum of the power supply voltage level and the voltage headroom. Using the earlier example of values, the second voltage level is the sum of 4.0 volts and 0.15 volts, or 4.15 volts.

If the interfaces do not determine that it is time to end the idle mode ("no" branch of the conditional block 608), then control flow of method 600 returns to block 606 where the interfaces maintain the idle mode. As described earlier, conditions for transitioning to another mode include one or more of determining a time interval has elapsed, determining an amount of data stored for transmission exceeds a threshold, and receiving a control signal indicating a transition from processing logic of the device. If the interfaces determine that it is time to end the idle mode ("yes" branch of the conditional block 608), then the interfaces operate the bidirectional data signal line in a data transmission mode with a series of pulses between the second voltage level and a sum of the second voltage level and a voltage headroom (block 610). Using the earlier example of values, the interfaces generate a series of pulses between 4.15 volts and 4.30 volts. The receiving logic converts the pulses on the single data signal line to two or more data signals to be stored in a buffer. When the communication protocol is the USB serial data communications protocol, the receiving logic converts the pulses to two data signals.

If the interfaces do not determine that it is time to end the data transmission mode ("no" branch of the conditional block 612), then control flow of method 600 returns to block 610 where the interfaces maintain the data transmission mode. Conditions for transitioning out of the data transmission mode include one or more of determining a time interval has elapsed, determining an amount of data transmitted exceeds a threshold, and receiving a control signal indicating a transition from processing logic of the device. If the interfaces determine that it is time to end the data transmission mode ("yes" branch of the conditional block 612), then control flow of method 600 returns to block 602 where the interfaces operate in the lower power idle mode.

Figure 8:
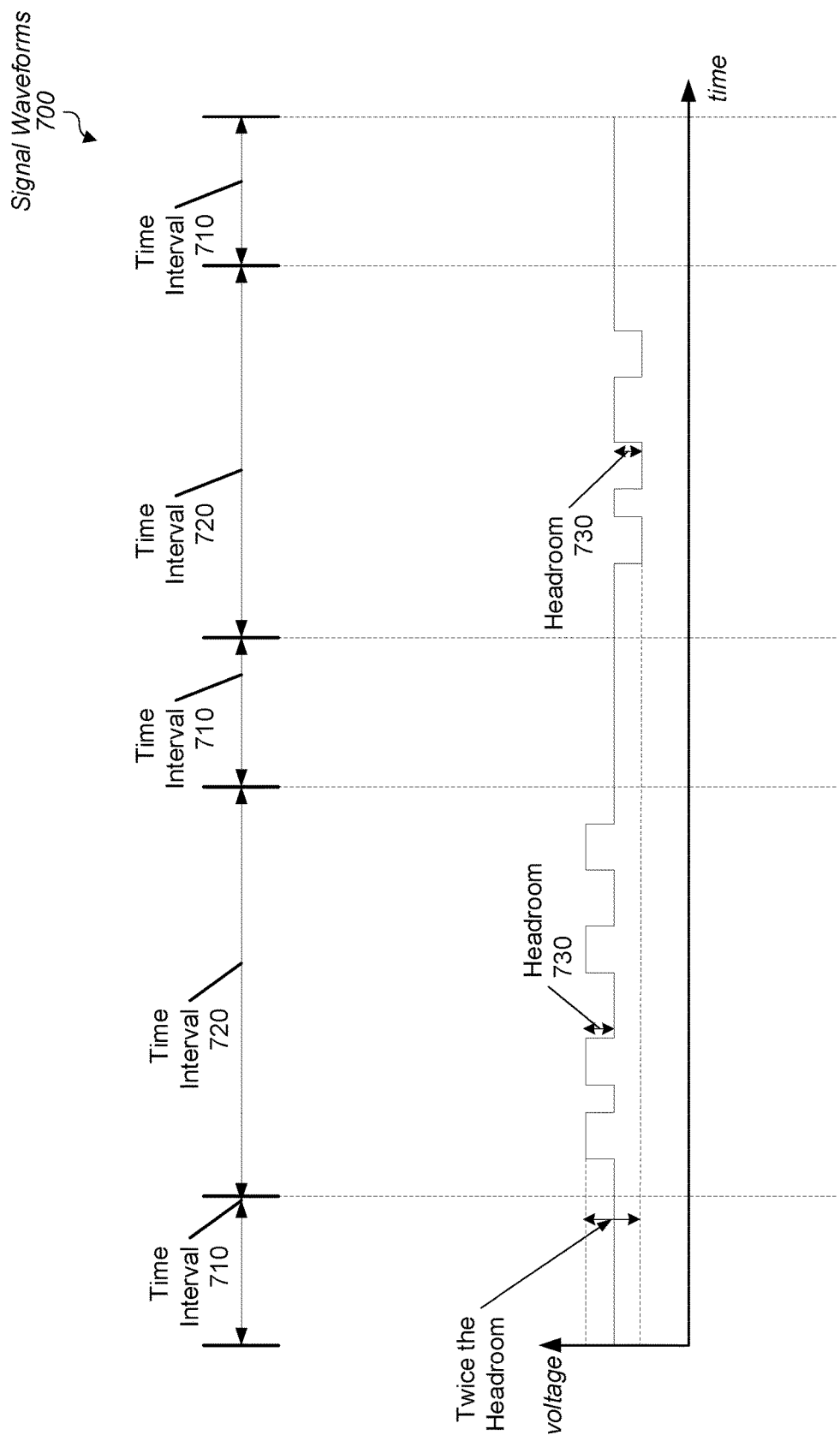
FIG. 8 is a block diagram of one embodiment of signal waveforms on a data line between devices.

Turning now to FIG. 8, a generalized block diagram of signal waveforms 700 is shown. In an embodiment, the time interval 710 represents a duration of time for an idle mode, whereas, the time interval 720 represents a duration of time for data transmission on a bidirectional data line. The voltage levels of the signals on the bidirectional data line are shown. During the idle mode, such as during each time interval 710, the bidirectional data line is held at a constant voltage level. During a first data transmission period, such as the first time interval 720, data is sent as a series of pulses. Rather than use a ground reference voltage level to measure the pulses, the same constant voltage level used during the previous idle mode is used. The voltage headroom 730 is added to the voltage level of the idle mode to indicate the pulses. In contrast, during the second data transmission period, such as the second time interval 720, data is again sent as a series of pulses. Rather than use the ground reference voltage level to measure the pulses, the same constant voltage level used during the previous idle mode is used. The voltage headroom 730 is removed from the voltage level of the idle mode to indicate the pulses.

Figure 9:
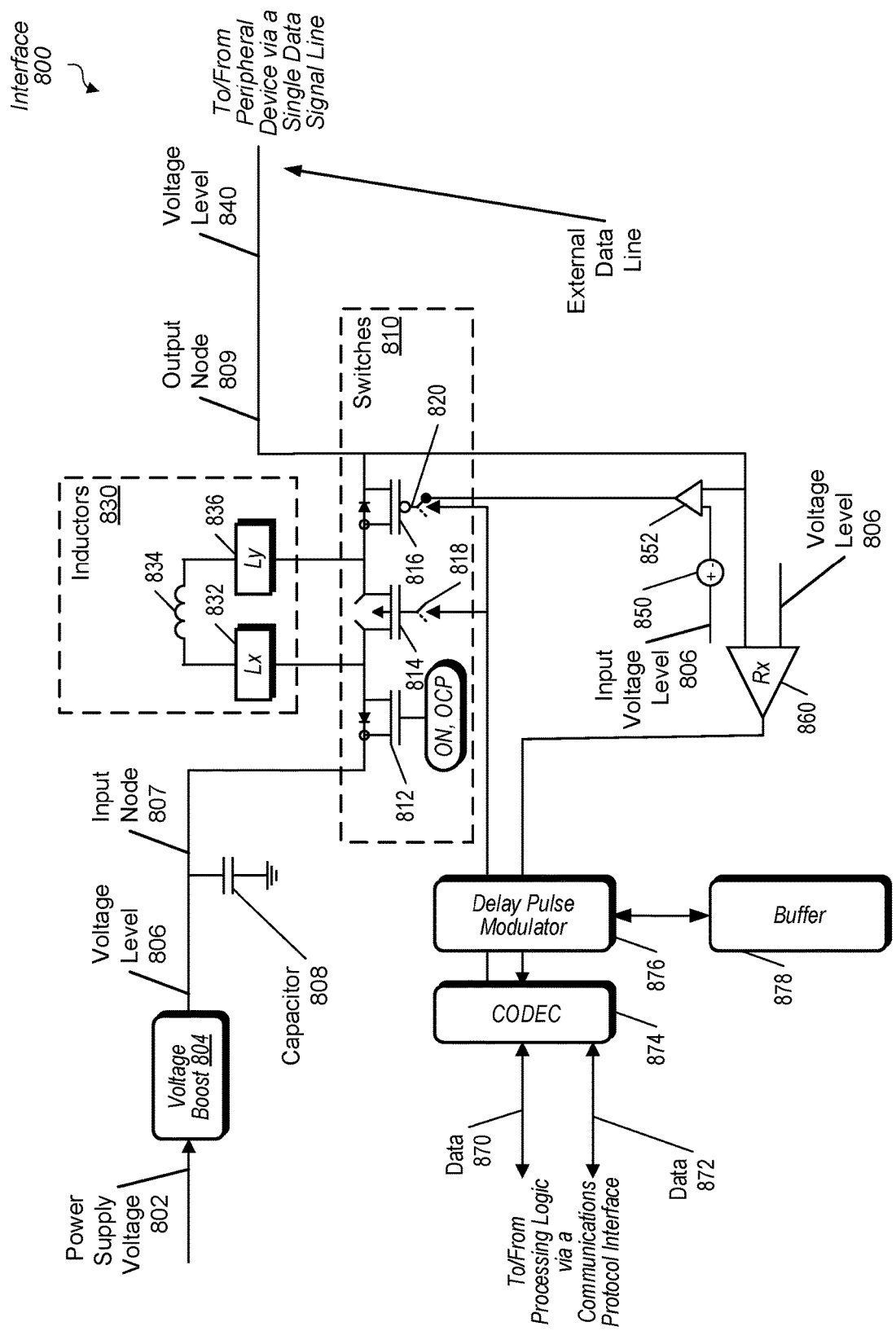
FIG. 9 is a block diagram of one embodiment of an interface for transferring data between devices.

Turning now to FIG. 9, a generalized block diagram of an I/O interface 800 of a host computing device (or interface 800) is shown. During a data transmission mode, the codec 874 receives data from processing logic of the host computing device such as the data on the data lines 870 and 872. When the communication protocol is the USB serial data communications protocol, the interface 800 receives two data signals. In other embodiments, another communications protocol and another number of data signal lines are used. In some embodiments, the data received on the data signal lines 870 and 872 are differential signals and the codec 874 converts the signals to digital signals, which are stored in the buffer 878 for later scheduling of the transmission of the data. As shown, the interface 800 receives a power supply voltage 802, which is increased by the voltage boost 804, such as a buck boost converter, to provide the voltage level 806. In some embodiments, the power supply voltage 802 is 4.0 volts and the voltage level 806 is greater than the power supply voltage 802 by twice a voltage headroom. When the voltage headroom is 0.15 volts, the voltage level 806 is 4.30 volts. In some embodiments, the increase of the power supply voltage level 802 to create the voltage level 806 is programmable.

In an embodiment, the capacitor 808 is selected to have a large value to remove voltage variations on the voltage level 806. For example, in some embodiments, the capacitor 808 has a capacitance of 5 to 60 micro farads. In an embodiment, the interface 800 includes a circuit element that includes the switches 810 and has an input node connected to input node 807 and has an output node connected to output node 809. This circuit element receives the voltage level 806 on input node 807 and provides the voltage level 840 on output node 809. In an embodiment, the series of switches 810 includes multiple serially connected switches for generating pulses on the output node 809 based on the voltage level 806 on the input node 807. In addition, the switches 810 generate pulses on the output node 809 based on the inputs to control circuitry from the delay pulse modulator (DPM) 876. In the illustrated embodiment, the control circuitry of the switches 812-816 includes switches 818 and 820. However, in other embodiments, a variety of other types of control circuitry are used. In an embodiment, the multiple serially connected switches of the switches 810 are implemented by field effect transistors (FETs). Although three transistors 812, 814 and 816 are shown, in other embodiments, another number of transistors is used. In one embodiment, the n-type transistor 812 (or nfet 812) is always enabled, or always turned on and includes one of a variety of circuits for over current protection (OCP). In the illustrated embodiment, the nfet 814 is enabled and disabled by a switch 818, and the pfet 816 is enabled and disabled by the switch 820. In various embodiments, the switches 818 and 820 are also implemented by transistors. The switches 818 and 820 receives input values from the delay pulse modulator 876.

In various embodiments, the output node 809 of the switches 810 is connected to the external peripheral device via the external single data signal line. In various embodiments, the interface 800 is replicated and the data signal line is one of multiple data signal lines of an external bidirectional bus between the host computing device and the peripheral device. Protection circuitry and noise reducing circuitry, such as passive devices like diodes, resistors and capacitors, are not shown for ease of illustration. The input node 807 of the switches 810, such as the terminal of the switch 812, receives the voltage level 806. Using the values of the earlier example, the switch 812 receives 4.30 volts. When the interface 800 operates in an idle mode, the switch 818 disables the nfet 814, which opens the switch 814, and causes the voltage level 806 to drive current through the serially connected inductors 832-836 of the inductors 830. Although three inductors are shown, in other embodiments, the inductors 830 includes another number of inductors. The inductors 830 reduce current ripple and boost the effective output impedance. The inductors 830 increase its voltage in response to any rapid change (time rate of change) of current flowing through the inductors 830, and reduces the effective gate-to-source voltage of the pfet 816. The increase in voltage of the inductors 830 also limits the change in current flowing from the voltage level 806 on the input node 807 to the voltage level 840 on the output node 809 when a pulse appears on the single data signal line connected to the external peripheral device.

In addition, when the interface 800 operates in the idle mode, the switch 820 selects the output of the operational amplifier 852 as the control input of the pfet 816. The control input of the pfet 816 is the gate terminal of the pfet 816. The operational amplifier 852 compares the voltage level 840 to the voltage level 806 less the value of the variable voltage source 850. When the interface 800 operates in the idle mode, the voltage source 850 is set at the voltage headroom, or 0.15 volts. Therefore, the input to the operational amplifier is 4.30 volts, which is the value of the voltage level 806, less the 0.15 volts, or 4.15 volts. When the voltage level 840 on the output node 809 equals the value of the other input of the operational amplifier 852, or 4.15 volts, there is no difference to be magnified by the operational amplifier 852. When the interface 800 operates in a lower power idle mode, in one embodiment, logic sets the programmable voltage source 850 at 0.25 volts, rather than 0.15 volts, which causes the operational amplifier 852 to control the switch 816 in a manner to provide the voltage level 840 at 4.05 volts. Accordingly, the interface 800 consumes less power during the lower power idle mode than the idle mode. Logic sets the programmable voltage source 850 at a variety of other voltage levels in other embodiments.

When the interface 800 operates in a data transmission mode, the switch 818 enables (closes) the switch 816, which causes signals to bypass the inductors 830 and generate a series of pulses on the output node 809 with values between the voltage level 806 (or 4.30 volts, in one example) and the sum of the power supply voltage and the voltage headroom (or 4.15 volts, in one example). The pulses are sent from the output node 809 to the external peripheral device on the single data signal line. When the interface 800 operates in a receiving mode, pulses are received on the output node 809 of the switches 810 and received by the operational amplifier 860. In various embodiments, the operational amplifier 860 has a faster response than the inductors 830. Therefore, the operational amplifier 860 processes the received pulses on the output node 809 faster than the inductors 830.

In the receiving mode, the switch 818 disables (opens) the switch 814 and connects the gate terminal of the pfet 816 to the control output of the delay pulse modulator 876, rather than the output of the operational amplifier 852. The operational amplifier 860 compares the received pulses to the voltage level 806 (or 4.30 volts, in one example). One or more of the delay pulse modulator 876 and the codec 874 convert the pulses to digital data signals such as using mappings as described earlier for the state table 150 (of FIG. 2). The converted data is stored in the buffer 878 for later transmission to processing logic of the host computing device.

Figure 10:
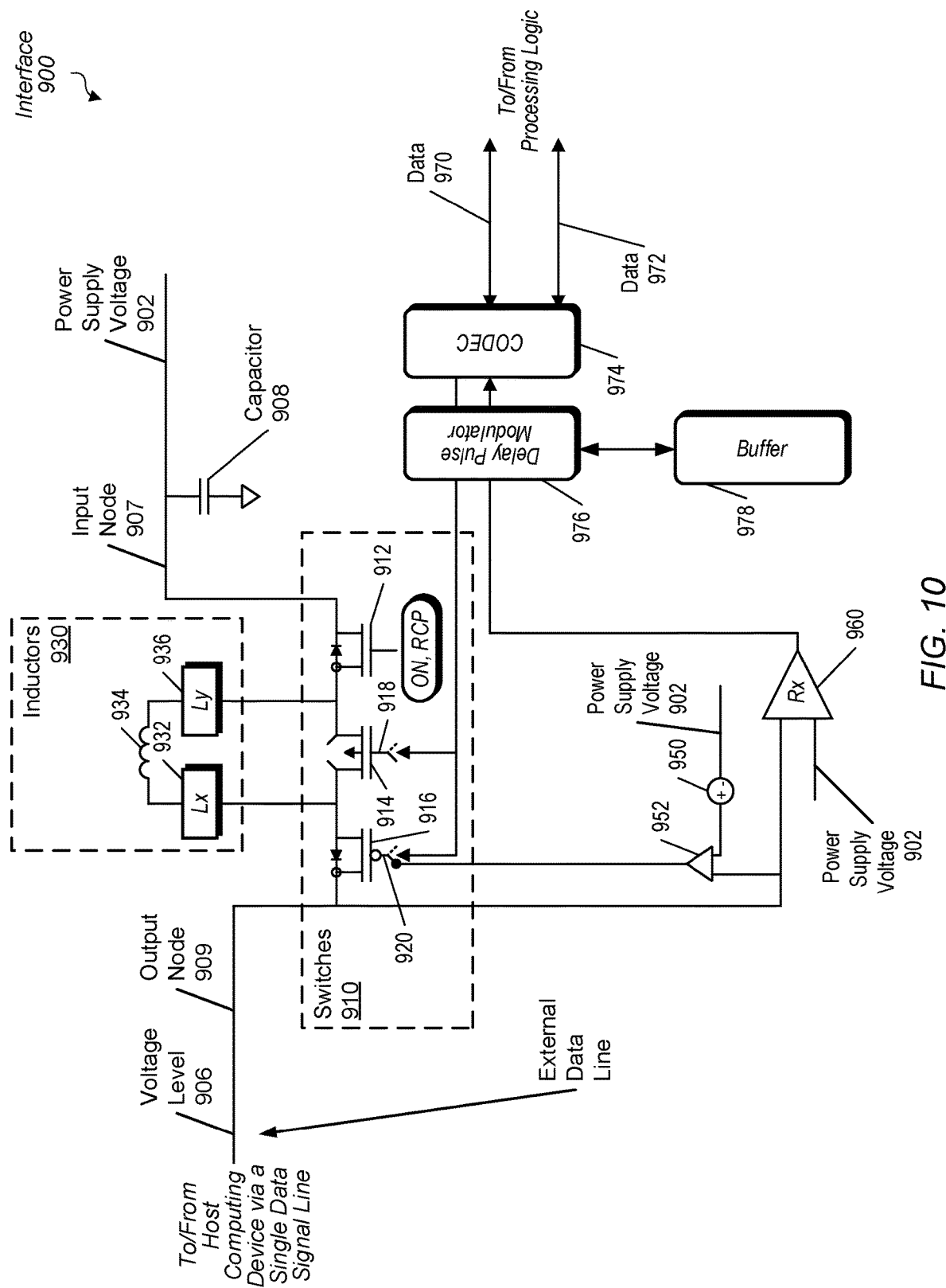
FIG. 10 is a block diagram of one embodiment of an interface for transferring data between devices.

Turning now to FIG. 10, a generalized block diagram of an I/O interface 900 of a peripheral device (or interface 900) is shown. In various embodiments, the interface 900 includes many of the components of the previously described interface 800 (of FIG. 9). However, in an embodiment, the interface 900 does not use a voltage booster, the polarity of the programmable voltage source 950 is reversed from the polarity of the voltage source 850, and the order of the switches 912, 914 and 916 are reversed from the order of the switches 812, 814 and 816. The switch 912 includes reverse current protection (RCP) circuitry, rather than the over protection circuitry (OCP) that the switch 812 uses. Using the earlier example values of the power supply voltage and the voltage headroom, the interface 900 generates pulses for data transmission between 4.0 volts and 4.15 volts, rather than between 4.15 volts and 4.30 volts as generated by the interface 800. The operational amplifier 960 compares pulses received on the single data signal line from the external host computing device to the power supply voltage 902 (or 4.0 volts, in one example). This comparison by the operational amplifier 960 is in contrast to the comparison of received pulses to the sum of the power supply voltage and twice the voltage headroom (or 4.3 volts, in one example) as performed by the operational amplifier 860 of the interface 800.

In some embodiments, the data received on the data signal lines 970 and 972 are differential signals and the codec 974 converts the signals to digital signals, which are stored in the buffer 978 for later scheduling of the transmission of the data. As shown, the interface 900 receives a power supply voltage 902. In some embodiments, the power supply voltage 902 is 4.0 volts, and during an idle mode of operation, the voltage level 906 is greater than the power supply voltage 902 by a voltage headroom, which is also used by an external host computing device. When the voltage headroom is 0.15 volts, the voltage level 906 on the switches output node 909 (or output node 909) is 4.15 volts when the interface 900 operates in the idle mode. In an embodiment, the capacitor 908 is selected to have a large value to remove voltage variations on the power supply voltage 902. For example, in some embodiments, the capacitor 908 has a capacitance of 5 to 90 micro farads.

In an embodiment, the interface 900 includes a circuit element that includes the switches 910 and has an input node connected to input node 907 and has an output node connected to output node 909. This circuit element receives the power supply voltage 902 on input node 907 and provides the voltage level 906 on output node 909. In an embodiment, the series of switches 910 includes multiple serially connected switches for generating pulses based on inputs to control circuitry from the delay pulse modulator 976. Similar to the interface 500, the switches in the interface 900 are implemented by transistors. Although three transistors 912, 914 and 916 are shown, in other embodiments, another number of transistors is used. In the illustrated embodiment, the control circuitry of the switches 912-916 includes switches 918 and 920. However, in other embodiments, a variety of other types of control circuitry are used.

In one embodiment, the n-type transistor 912 (or nfet 912) is always enabled, or always turned on. In the illustrated embodiment, the nfet 914 is individually enabled and disabled by a switch 918, and the pfet 916 is individually enabled and disabled by the switch 920. In various embodiments, the switches 918 and 920 are also implemented by transistors. The switches 918 and 920 receives input values from the delay pulse modulator 976. In various embodiments, the output node 909 of the switches 910 is connected to the external host computing device via the external single data signal line. In various embodiments, the interface 900 is replicated and the data signal line is one of multiple data signal lines of an external bidirectional bus between the host computing device and the peripheral device. Protection circuitry and noise reducing circuitry such as passive devices like diodes, resistors and capacitors are not shown for ease of illustration. The switches input node 907 (or input node 907) of the switches 910, such as the terminal of the switch 912, receives the power supply voltage 902. Using the values of the earlier example, the switch 912 receives 4.0 volts on the input node 907 and the switch 916 provides 4.15 volts on the output node 909 when the interface 900 operates in the idle mode.

When the interface 900 operates in the idle mode, the switch 918 disables the nfet 914, which opens the switch 914, and causes the input voltage level 906 to drive current through the serially connected inductors 932-936 of the inductors 930. Although three inductors are shown, in other embodiments, the inductors 930 includes another number of inductors. The inductors 930 reduce current ripple and boost the effective output impedance. The inductors 930 increase its voltage in response to any rapid change (time rate of change) of current flowing through the inductors 930, and reduces the effective gate-to-source voltage of the pfet 916. The increase in voltage of the inductors 930 also limits the change in current flowing from the voltage level 906 to the power supply voltage 902 when a pulse appears on the single data signal line connected to the external host computing device.

In addition, when the interface 900 operates in the idle mode, the switch 920 selects the output of the operational amplifier 952 as the control input of the pfet 916. The control input of the pfet 916 is the gate terminal of the pfet 916. The operational amplifier 952 compares the voltage level 906 to the sum of the power supply voltage 902 and the variable voltage source 950. When the interface 900 operates in the idle mode, in an embodiment, the voltage source 950 is set at the voltage headroom, or 0.15 volts. Therefore, when using the values of the earlier examples, the input to the operational amplifier 952 is the sum of 4.0 volts and 0.15 volts, or 4.15 volts. When the voltage level 906 equals this sum, or 4.15 volts, there is no difference to be magnified by the operational amplifier 952. As described earlier for the interface 500, when the interface 900 operates in a lower power idle mode, in one embodiment, logic sets the programmable voltage source 950 at 0.05 volts, rather than 0.15 volts, which causes the operational amplifier 952 to control the switch 916 in a manner to provide the voltage level 906 at 4.05 volts. Accordingly, the interface 900 consumes less power during the lower power idle mode than the idle mode. Logic sets the programmable voltage source 950 at a variety of other voltage levels in other embodiments.

When the interface 900 operates in a data transmission mode, the switch 918 enables (closes) the switch 916, which causes signals to bypass the inductors 930 and generate a series of pulses on the output node 909 with values between the power supply voltage (or 4.0 volts, in one example) and the sum of the power supply voltage and the voltage headroom (or 4.15 volts, in one example). The pulses are sent from the output node 909 to the external host computing device on the single data signal line. When the interface 900 operates in a receiving mode, pulses are received by the operational amplifier 960. In various embodiments, the operational amplifier 960 has a faster response than the inductors 930. Therefore, the operational amplifier 960 processes the received pulses on the output node 909 faster than the inductors 930.

In the receiving mode, the switch 918 disables (opens) the switch 914 and connects the gate terminal of the pfet 916 to the control output of the delay pulse modulator 976, rather than the output of the operational amplifier 952. The operational amplifier 960 compares the received pulses to the power supply voltage 902 (or 4.0 volts, in one example). One or more of the delay pulse modulator 976 and the codec 974 convert the pulses to digital data signals such as using mappings as described earlier for the state table 200 (of FIG. 2). The converted data is stored in the buffer 978 for later transmission to processing logic of the peripheral device.

Figure 11:
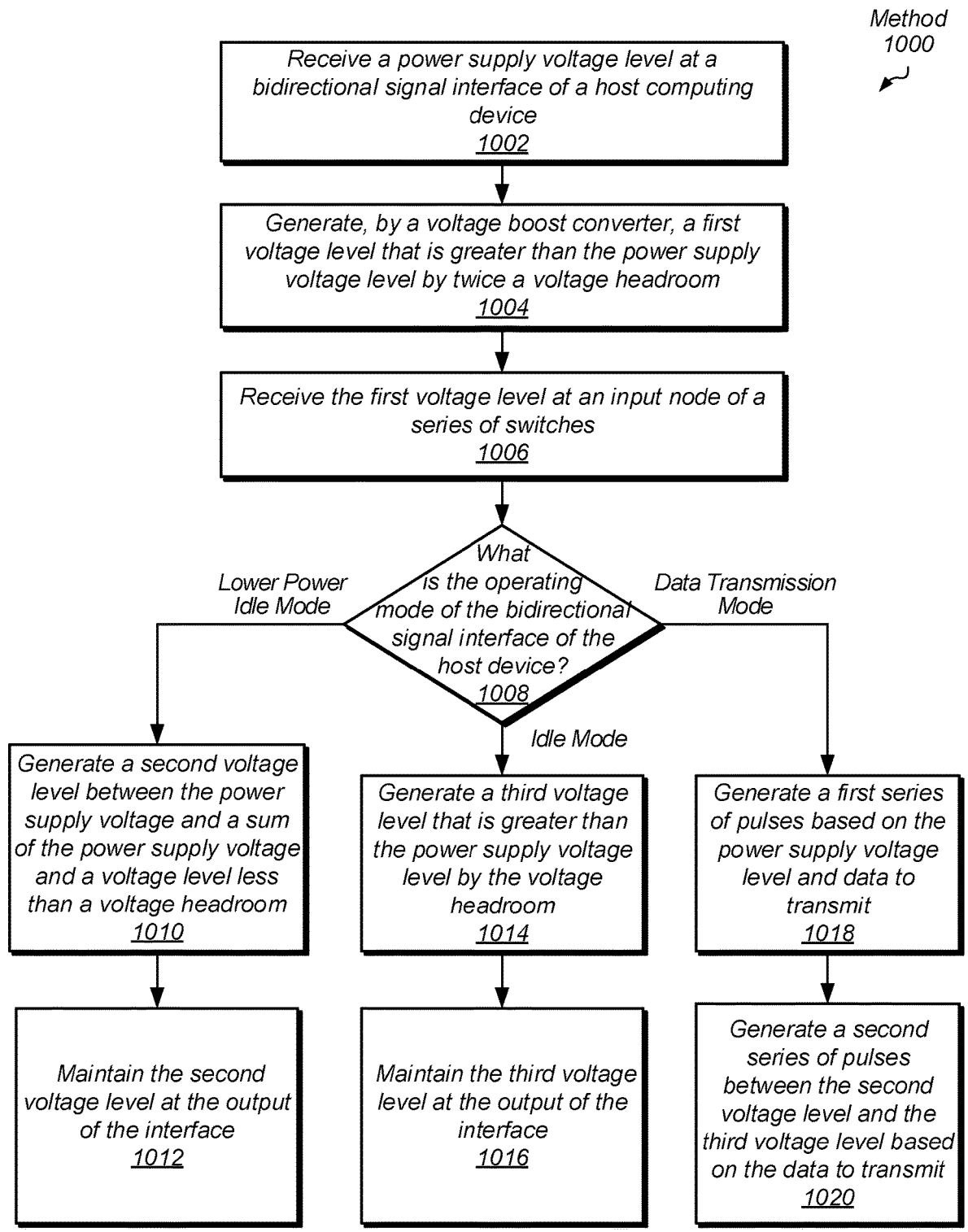
FIG. 11 is a flow diagram of one embodiment of a method for efficiently transferring data between devices.

Each of methods 1000 and 1100 describe the interfaces of the host computing device and the peripheral device when these interfaces are either in one of multiple idle modes or transmitting data. When receiving data, the steps described earlier for the interfaces 800 and 900 are used. Referring now to FIG. 11, a generalized flow diagram of one embodiment of a method 1000 for efficiently transferring data between devices is shown. Interface logic of a host computing device for a bidirectional signal line receives a power supply voltage level (block 1002). A voltage boost converter generates a first voltage level that is greater than the power supply level by twice a voltage headroom (block 1004). In an embodiment, the voltage boost converter is a direct current (DC) to DC buck boost converter.

A series of switches of the interface logic receives the first voltage level at an input node (block 1006). In an embodiment, the series of switches are two or more serially connected transistors such as field effect transistors (FETs). One of the switches is connected in an electrically parallel configuration with one or more serially connected inductors. When this switch is closed, electrical signals flow through this switch, rather than the serially connected inductors. If the operating mode of the host computing device is a lower power idle mode ("lower power idle mode" branch of the conditional block 1008), then the interface of the host computing device generates a second voltage level that is between the power supply voltage level and a sum of the power supply voltage and a voltage level less than the voltage headroom (block 1010). As described earlier, using the earlier example of values, the interface generates the second voltage level as a voltage level greater than or equal to 4.0 volts and less than 4.15 volts. The interface maintains the second voltage level at the output of the interface (block 1012).

If the operating mode of the host computing device is an idle mode ("idle mode" branch of the conditional block 1008), then the interface generates a third voltage level that is greater than the power supply voltage level by the voltage headroom (block 1014). As described earlier, using the earlier example of values, the interface generates the third voltage level as the sum of 4.0 volts and 0.15 volts, or 4.15 volts. The interface maintains the third voltage level at the output of the interface (block 1016).

If the operating mode of the host computing device is a data transmission mode ("data transmission mode" branch of the conditional block 1008), then the interface generates a first series of pulses based on the power supply voltage level and data to transmit (block 1018). In an embodiment, a delay pulse modulator retrieves data from a buffer. The data was previously converted by a codec from two separate analog differential signals into a single digital signal and a representation of this single digital signal, or pulse, is stored in the buffer. The delay pulse modulator sends the pulses to control circuitry of the series of switches.

In one embodiment, one switch in the series of switches is connected in a parallel configuration with one or more serially connected inductors. During either one of the idle modes, this switch is open, which causes signals to route through the one or more serially connected inductors. During the data transmission mode, this switch is closed, which causes signals to bypass the one or more serially connected inductors. The series of switches generate a second series of pulses between the second voltage level and the third voltage level based on the data to transmit (block 1020). The second series of pulses is also dependent on the control circuitry. Using the earlier example of values, the interfaces generate a series of pulses between 4.15 volts and 4.30 volts. The receiving logic converts the pulses on the single data signal line to two or more data signals to be stored in a buffer. When the communication protocol is the USB serial data communications protocol, the receiving logic converts the pulses to two data signals.

Figure 12:
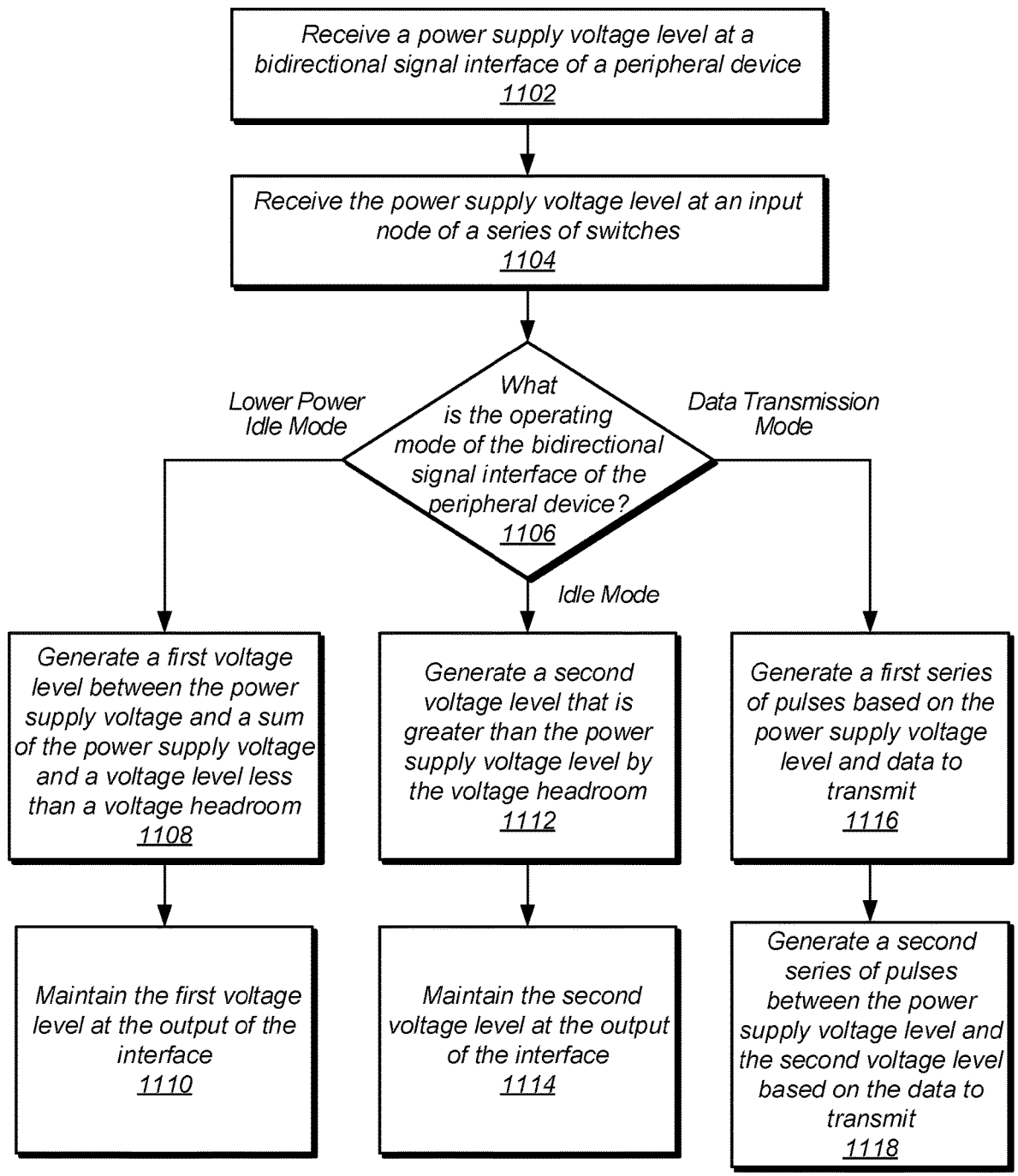
FIG. 12 is a flow diagram of one embodiment of a method for efficiently transferring data between devices.

Referring now to FIG. 12, a generalized flow diagram of one embodiment of a method 1100 for efficiently transferring data between devices is shown. Interface logic of a peripheral device for a bidirectional signal line receives a power supply voltage level (block 1102). A series of switches of the interface logic receives the first voltage level at an input node (block 1104). In various embodiments, the series of switches have a mirrored configuration of a series of switches in a corresponding host computing device. If the operating mode of the peripheral device is a lower power idle mode ("lower power idle mode" branch of the conditional block 1106), then the interface generates a first voltage level that is between the power supply voltage level and a sum of the power supply voltage and a voltage level less than the voltage headroom (block 1108). As described earlier, using the earlier example of values, the interface of the peripheral device generates the first voltage level as a voltage level greater than or equal to 4.0 volts and less than 4.15 volts. The interface maintains the first voltage level at the output of the interface (block 1110).

If the operating mode of the host computing device is an idle mode ("idle mode" branch of the conditional block 1108), then the interface generates a second voltage level that is greater than the power supply voltage level by the voltage headroom (block 1112). As described earlier, using the earlier example of values, the interface generates the third voltage level as the sum of 4.0 volts and 0.15 volts, or 4.15 volts. The interface maintains the second voltage level at the output of the interface (block 1114).

If the operating mode of the host computing device is a data transmission mode ("data transmission mode" branch of the conditional block 1108), then the interface generates a first series of pulses based on the power supply voltage level and data to transmit (block 1116). The series of switches generate a second series of pulses between the power supply voltage level and the second voltage level based on the data to transmit (block 1118). The second series of pulses is also dependent on the control circuitry. Using the earlier example of values, the interface of the peripheral device generates a series of pulses between 4.0 volts and 4.15 volts. The receiving logic converts the pulses on the single data signal line to two or more data signals to be stored in a buffer. When the communication protocol is the USB serial data communications protocol, the receiving logic converts the pulses to two data signals.

Figure 13:
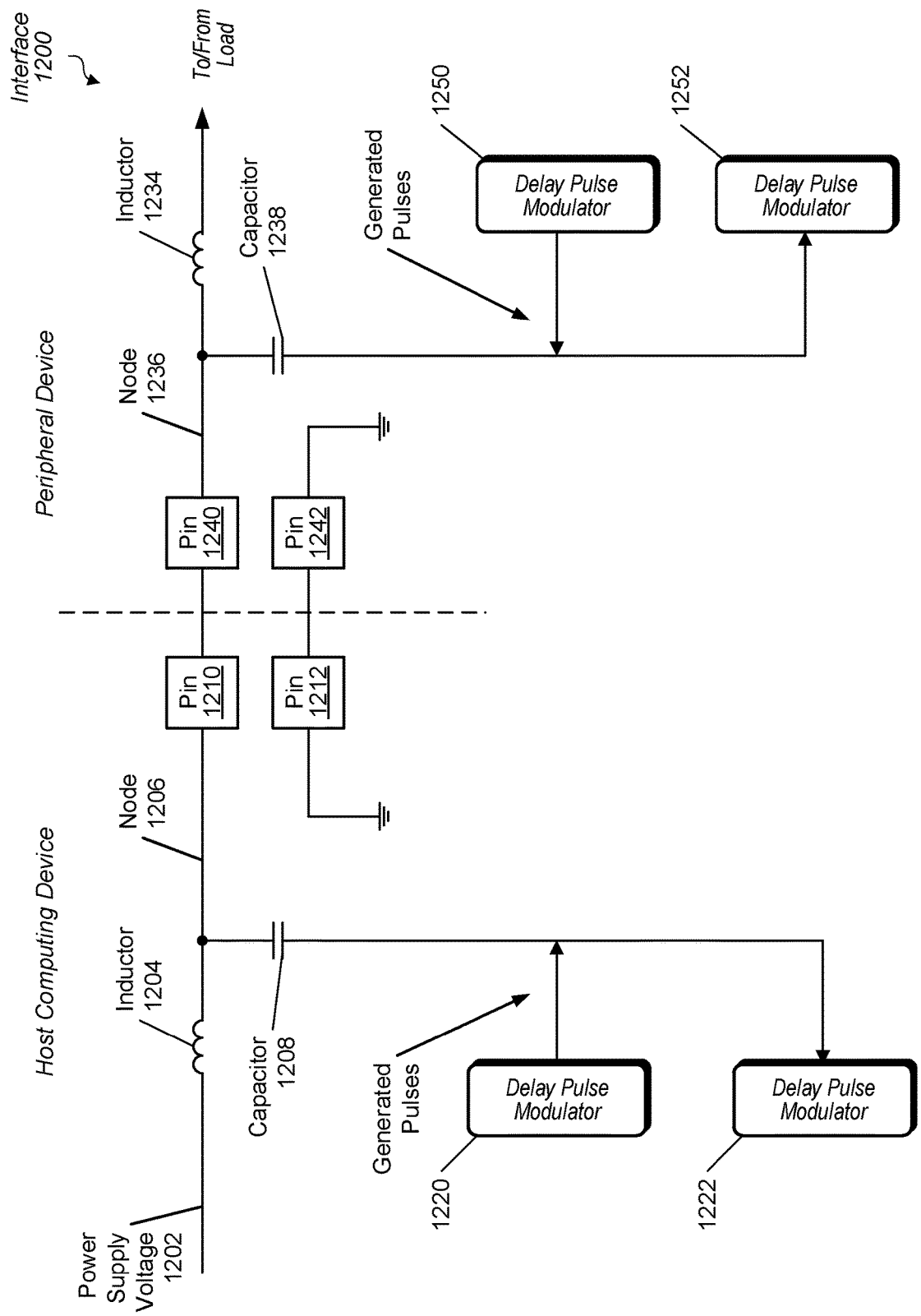
FIG. 13 is a block diagram of one embodiment of an interface for transferring data between devices.

Turning now to FIG. 13, a generalized block diagram of an I/O interface 1200 between a host computing device and a peripheral device is shown. The I/O interface 1200 may also be referred to as interface 1200. In the illustrated embodiment, the host computing device is shown on the left while the peripheral device is shown on the right. However, in other embodiments, the placement is reversed and the components are switched. As shown, the host computing device and the peripheral device communicate across signal lines between pins 1210 and 1240 and pins 1212 and 1242. In an embodiment, the signal line between pins 1210 and 1240 transmits data as pulses, whereas, the signal line between pins 1212 and 1242 transmits a ground reference voltage level. In various embodiments, the interface 1200 includes many of the components of the previously described interfaces 800 and 900 (of FIGS. 9 and 10).

In some embodiments, the power supply voltage 1202 is 4.0 volts, and no voltage booster is used. Similar to the inductors 830 described earlier for interface 800, the inductor 1204 reduces current ripple and boosts the effective output impedance. The inductor 1204 increase its voltage in response to any rapid change (time rate of change) of current flowing through the inductor 1204. The increase in voltage of the inductor 1204 also limits the change in current flowing from the power supply voltage 1202 to the voltage level on the node 1206 when a pulse appears on the single data signal line between the pins 1210 and 1240. The inductor 1234 has similar behavior as inductor 1204. The capacitor 1208 is an alternating current (AC) coupling capacitor. The capacitor 1208 couples an AC signal between node 1206 and the delay pulse modulators 1220 and 1222. The capacitor 1208 prevents a direct current (DC) signal from being passed while permitting only an AC signal to pass. The capacitor 1238 has similar behavior as capacitor 1208.

The host computing device includes a transmission delay pulse modulator (DPM) 1220 and a receive DPM 1222. During a data transmission mode, a codec (not shown) receives data from processing logic of the host computing device. As described earlier, in some embodiments, the USB serial data communications protocol is used. In an embodiment, the processing logic of the host computing device provides differential signals to the codec, which converts the signals to digital signals. The transmission DPM 1220 conveys the digital signals as pulses on node 1206.

Referring briefly to the data transmission 100 and 200 (of FIG. 1 and FIG. 3), in an embodiment, the transmitter continues to send pulses, but in some embodiments, the transmitter sends both positive and negative pulses, rather than only positive pulses. Examples of these pulses are provided in the FIGS. 14-15. In an embodiment, the transmission DPM 1220 of interface 1200 receives data, such as data 202 and 204 (of FIG. 3), and conveys both positive and negative pulses. Control logic in the peripheral device interprets the series of positive and negative pulses from the transmission DPM 1220 as symbols. In an embodiment, the symbol generation table 150 (of FIG. 2) is used by control logic in the peripheral device to map a 2-bit previous pin state to a 2-bit current pin state. The table 150 performs the mapping based on both a number and an order of the positive and negative pulses received on a single data signal line during a time interval. The transmission DPM 1250 in the peripheral device has similar behavior as the transmission DPM 1220.

When the host computing device operates in a receiving mode, pulses are received on the node 1206 and received by the receiving DPM 1222. In various embodiments, the receiving DPM 1222 and any input circuitry (not shown) such as one or more buffers, an operational amplifier, or other has a faster response than the inductor 1204. Therefore, the receiving DPM 1222 processes the received pulses on the node 1206 faster than the inductor 1204. One or more of the receiving DPM 1222 and any codec (not shown) convert the pulses to digital data signals such as using mappings as described earlier for the state table 150 (of FIG. 2). In an embodiment, the converted data is stored in a buffer for later transmission to processing logic of the host computing device. In various embodiments, the receiving DPM 1252 in the peripheral device has similar behavior as the receiving DPM 1222.

Figure 14:
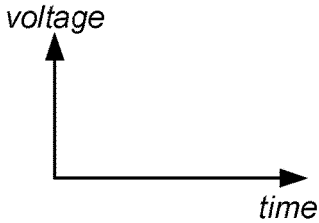
FIG. 14 is a block diagram of one embodiment of symbol mappings used by a symbol generation table.

Turning now to FIG. 14, a generalized block diagram of one embodiment of symbol mappings 1300 is shown. In various embodiments, the symbol mappings 1300 are used with the same table 150 (of FIG. 2), but the symbol mappings 1300 are different from the symbol mappings 160 (of FIG. 2). In contrast to the symbol mappings 160, the symbol mappings 1300 use both positive and negative pulses, rather than only positive pulses. In an embodiment, a transmitter and a receiver utilizing the interface 1200 (of FIG. 12) also uses the table 150 and the symbol mappings 1300 to support the transfer of parallel multibit data as serial data on a single data line. In various embodiments, each of the transmitter and the receiver use a copy of the table 150 and the symbol mappings 1300. The transmitter determines it is time to send data based on a variety of conditions. When the transmitter has parallel multibit data to send to the receiver, the transmitter divides the parallel multibit data into contiguous portions or sections. Each section has a current pin state. In one embodiment, each section has 2 bits. In other embodiments, each section has another number of parallel multiple bits.

The transmitter maintains a previous pin state, which was the current pin state during a previous data transfer. Using table 150, the control logic of the transmitter identifies a row of table 150 based on the previous pin state and identifies a column based on the current pin state. The logic of the transmitter uses the resulting symbol and the symbol mappings 1300 to determine both a number and an order of positive and negative pulses to send within a time interval to represent the current pin state. For example, when the previous pin state is 2'b01 and the current pin state to send is 2'b10, the control logic of the transmitter uses table 150 to identify the symbol "D." The control logic uses the symbol mappings 1300 to determine the symbol "D" represents 3 iterations of a combination of a positive pulse followed by a negative pulse to send on a serial data line to a receiver. Alternatively, the symbol "D" represents 3 iterations of a negative pulse followed by a positive pulse to send on a serial data line to a receiver. The receiver includes one of a variety of detection circuits for interpreting the received symbol "D." In some embodiments, the alternative representation of symbol "D" is used to allow additional sideband data to be sent simultaneously with the data transmission on the serial data line. Similarly, symbols "B" and "C" have alternative representations to be used for sideband data transmission.

In an embodiment, when the transmitter sends no pulses during the time interval, the current pin state equals the previous pin state. This mapping is indicated by the top row of the symbol mappings 1300, and the symbol "A" in the table 150. The symbol mappings 1300 maps no pulses, or zero pulses, to the symbol "A." When the transmitter sends one pulse during a time interval, which maps to the symbol "B," only a particular bit of the current pin state changes. In some embodiments, the particular bit is the least significant bit indicated as "b1" in the table 150. In other embodiments, the particular bit is the most significant bit indicated as "b0" in the table 150. In some embodiments, the method 300 (of FIG. 4) uses the symbol mappings 1300, rather than the symbol mappings 160, to convert data transmitted on the serial data line. Additionally, in an embodiment, computing system 500 uses symbol mappings 1300 for data transmission on a serial data line.

Figure 15:
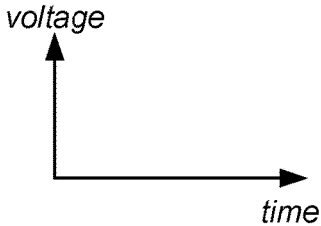
FIG. 15 is a block diagram of one embodiment of symbol mappings used by a symbol generation table.

Turning now to FIG. 15, a generalized block diagram of one embodiment of symbol mappings 1400 is shown. In various embodiments, the symbol mappings 1400 are used with the same table 150 (of FIG. 2). Similar to the symbol mappings 1300, the symbol mappings 1400 use both positive and negative pulses, rather than only positive pulses. In an embodiment, a transmitter and a receiver utilizing the interface 1200 (of FIG. 12) also uses the table 150 and the symbol mappings 1400 to support the transfer of parallel multibit data as serial data on a single data line. In an embodiment, at least symbol "D" of symbol mappings 1400 differs from the corresponding symbol "D" of symbol mappings 1300. For example, one example of symbol "D" of symbol mappings 1400 uses two positive pulses like symbol "C," but the two positive pulses are separated by two consecutive negative pulses. In other embodiments, one or more other symbols of symbol mappings 1400 differ from the corresponding symbol of symbol mappings 1300. Similar to the symbol mappings 1300, the symbol mappings 1400 uses alternative representations of symbols. In an embodiment, the alternative symbol representations allow additional sideband data to be sent simultaneously with the data transmission on the serial data line. In some embodiments, the method 300 (of FIG. 4) uses the symbol mappings 1400, rather than the symbol mappings 160 or symbol mappings 1300, to convert data transmitted on the serial data line. Additionally, in an embodiment, computing system 500 uses symbol mappings 1400 for data transmission on a serial data line.

In various embodiments, program instructions of a software application may be used to implement the methods and/or mechanisms previously described. The program instructions may describe the behavior of hardware in a high-level programming language, such as C. Alternatively, a hardware design language (HDL) may be used, such as Verilog. The program instructions may be stored on a non-transitory computer readable storage medium. Numerous types of storage media are available. The storage medium may be accessible by a computer during use to provide the program instructions and accompanying data to the computer for program execution. In some embodiments, a synthesis tool reads the program instructions in order to produce a netlist including a list of gates from a synthesis library.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. An apparatus comprising:
a first interface configured to receive data from external processing logic;
a second interface configured to transfer data on one or more bidirectional lines; and
control circuitry;
wherein in response to receiving parallel data on a plurality of pins of the first interface, the control circuitry is configured to:
determine a previous state of the plurality of pins of the first interface, the previous state of the plurality of pins representing a state of the plurality of pins prior to receipt of the parallel data;
determine a count, wherein the count is based at least in part on the previous state; and
convey a number of pulses equal to the count as serial data on the second interface.

2. The apparatus as recited in claim 1, wherein the control circuitry is further configured to:
determine a current state corresponding to the parallel data; and
determine the count of pulses based further on the current state.

3. The apparatus as recited in claim 1, wherein a first number of the plurality of pins of the first interface is greater than a second number of the one or more bidirectional lines.

4. The apparatus as recited in claim 1, wherein the control circuitry is further configured to generate a first pulse of the count of pulses responsive to determining an initial transition on one of the plurality of pins of the first interface.

5. The apparatus as recited in claim 1, wherein the control circuitry is further configured to:
receive the data on the first interface within a first time interval; and
convey the count of pulses on the second interface prior to the first time interval elapsing.

6. The apparatus as recited in claim 5, wherein the previous state is a current state of an immediately previous time interval before the first time interval.

7. The apparatus as recited in claim 5, wherein the previous state is a default initial state responsive to determining the first time interval is an initial time interval.

8. A method, comprising:
transferring data, by a first interface, on one or more bidirectional lines with an external device;
conveying data, by a second interface, to external processing logic;
in response to receiving, by control circuitry, parallel data on a plurality of pins of the first interface:
determining, by the control circuitry, a previous state of the plurality of pins of the first interface, the previous state of the plurality of pins representing a state of the plurality of pins prior to receipt of the parallel data;
determining, by the control circuitry, a count, wherein the count is based at least in part on the previous state; and
conveying, by the control circuitry, a number of pulses equal to the count as serial data on the second interface.

9. The method as recited in claim 8, further comprising:
determining, by the control circuitry, a current state corresponding to the parallel data; and
determining, by the control circuitry, the count of pulses based further on the current state.

10. The method as recited in claim 8, further comprising incrementing, by the control circuitry, the count of pulses responsive to detecting an event on the one or more bidirectional lines, wherein the event comprises a transition from an idle voltage level to a data transmitting voltage level.

11. The method as recited in claim 10, wherein:
the idle voltage level is greater than a power supply voltage level by a voltage headroom; and
the data transmitting voltage level is greater than the idle voltage level by the voltage headroom.

12. The method as recited in claim 11, wherein to detect a pulse, the method further comprises comparing, by the control circuitry, a voltage level on a bidirectional line to the power supply voltage.

13. The method as recited in claim 10, wherein:
the idle voltage level is greater than a power supply voltage level by a voltage headroom; and
the data transmitting voltage level is the power supply voltage level.

14. The method as recited in claim 13, wherein to detect a pulse, the method further comprises comparing, by the control circuitry, a voltage level on a bidirectional line to a voltage greater than the power supply voltage by twice the voltage headroom.

15. The method as recited in claim 9, wherein:
the previous state is a current state of an immediately previous time interval before a first time interval; and
receiving, by the control circuitry, the count of pulses on the first interface within the first time interval.

16. A bidirectional signal interface comprising:
a host computing device;
a peripheral device; and
a bidirectional data line between the host computing device and the peripheral device; and
wherein in response to receiving parallel data on a plurality of pins, the peripheral device is configured to:
determine a previous state of the plurality of pins, the previous state of the plurality of pins representing a state of the plurality of pins prior to receipt of the parallel data;
determine a count, wherein the count is based at least in part on the previous state; and
convey a number of pulses equal to the count as serial data on the bidirectional data line.

17. The bidirectional signal interface as recited in claim 16, wherein in response to determining a mode of operation is a power efficient mode, the peripheral device is configured to:
store data received on the plurality of pins; and
convey a constant voltage level on the bidirectional data line.

18. The bidirectional signal interface as recited in claim 17, wherein in response to determining a transition to data transmission of the power efficient mode, the peripheral device is further configured to retrieve the parallel data to transmit as serial data from a buffer, rather than from the plurality of pins.

19. The bidirectional signal interface as recited in claim 16, wherein the peripheral device is further configured to:
    determine a current state corresponding to the parallel data; and
    determine the count of pulses based further on the current state.

20. The bidirectional signal interface as recited in claim 16, wherein the peripheral device is further configured to generate a first pulse of the count of pulses responsive to determining an initial transition on the plurality of pins.

\* \* \* \* \*